(12) United States Patent
Nagayama

(10) Patent No.: US 7,728,797 B2
(45) Date of Patent: Jun. 1, 2010

(54) ORGANIC ELECTROLUMINESCENCE DISPLAY APPARATUS, METHOD OF PRODUCING THE SAME, AND METHOD OF REPAIRING A DEFECT

(75) Inventor: Kohei Nagayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 481 days.

(21) Appl. No.: 11/747,626

(22) Filed: May 11, 2007

(65) Prior Publication Data

US 2007/0273294 A1 Nov. 29, 2007

(30) Foreign Application Priority Data

May 23, 2006 (JP) ............................. 2006-142738

(51) Int. Cl.
*G09G 3/30* (2006.01)
(52) U.S. Cl. ........................... 345/76; 345/84; 345/204; 345/690
(58) Field of Classification Search ............. 345/76–77, 345/80, 84, 90, 103, 207, 690, 204; 315/169.2–169.3
See application file for complete search history.

(56) References Cited

U.S. PATENT DOCUMENTS

2003/0193493 A1* 10/2003 Ozawa ....................... 345/204
2004/0070581 A1* 4/2004 Hiraki et al. ................. 345/209
2005/0168491 A1* 8/2005 Takahara et al. ............. 345/690
2005/0196892 A1* 9/2005 Yamagata et al. ............. 438/79
2008/0084365 A1* 4/2008 Takahara et al. .............. 345/76

FOREIGN PATENT DOCUMENTS

| JP | 61-114493 | 6/1986 |
| JP | 4-014794 | 1/1992 |
| JP | 2003-282253 | 10/2003 |
| JP | 2004-199970 | 7/2004 |

* cited by examiner

*Primary Examiner*—David Hung Vu
*Assistant Examiner*—Tung X Le
(74) *Attorney, Agent, or Firm*—Fitzpatrick, Cella, Harper & Scinto

(57) ABSTRACT

Provided is an organic EL display apparatus capable of opening and breaking a defective portion without degrading a normal portion of a pixel, and a method of producing the same. The method of producing an organic EL display apparatus in which a plurality of pixels including organic EL devices are arranged includes the steps of: forming an organic EL device formed of a light emitting layer made of an organic compound between a cathode electrode and an anode electrode (Step S1); detecting a defective pixel in which a cathode electrode and an anode electrode are short-circuited (Step 2); and repairing the defective pixel to be opened by selectively applying a voltage between the cathode electrode and the anode electrode with respect to the defective pixel (Step S3).

12 Claims, 15 Drawing Sheets

PICTURE SIGNAL

ORGANIC ELECTROLUMINESCENCE DISPLAY APPARATUS, METHOD OF PRODUCING THE SAME, AND METHOD OF REPAIRING A DEFECT

BACKGROUND OF THE INVENTION

1. Field of the Invention

The present invention relates to an organic electroluminescence (EL) display apparatus, a method of producing the same, a method of repairing a defect, and a repair apparatus. In particular, the present invention relates to a method of selectively repairing a pixel having a defective portion in which a cathode electrode and an anode electrode of an organic EL device are short-circuited, so as to enhance a yield of a repair display.

2. Description of the Related Art

In recent years, an EL display apparatus (organic EL display) has been developed actively, which is capable of being made thinner than a cathode ray tube (CRT), obtaining a wider viewing angle than a liquid crystal display apparatus, and being reduced in weight and cost.

The organic EL display generally has a configuration in which an organic light emitting layer is interposed between an anode electrode and a cathode electrode, and light is emitted when a current flows between the electrodes by an external drive circuit. Hereinafter, a device including a pair of electrodes and an organic light emitting layer will be referred to as "organic EL light emitting device" or "organic EL device".

In a simple matrix system, an anode electrode and a cathode electrode interposing an organic light emitting layer are arranged so as to constitute an XY matrix electrode, and are orthogonal to each other. A crossing point of the XY matrix electrode constitutes one pixel.

According to operations of an active matrix organic EL display with a thin film transistor (TFT), a scanning pulse voltage is applied successively to a scanning line in an X-direction, and TFTs whose gate terminals are connected to the scanning line are turned on at a time. Simultaneously, a signal voltage is applied to a signal line in a Y-direction, and charge is accumulated in a capacitance of each pixel through the TFT. When scanning of one line is completed, the TFTs are turned off, and the charge accumulated in a pixel capacitance remains as it is. As a result, an arbitrary applied voltage is set.

In the organic EL display, in a case where the anode electrode and the cathode electrode interposing the organic light emitting layer are short-circuited, an organic EL device in that portion does not emit light, with the result that a non-lighting defect occurs.

The short-circuit between the electrodes is caused by adhesion of foreign matters, a pin-hole of an organic light emitting layer, or the like. Generally, the thickness of the organic light emitting layer formed between the electrodes is very small, that is, about several 10 nm to 100 nm, and a large number of non-lighting pixels are likely to be caused by the short-circuit between the electrodes. In the organic EL display, it is very difficult to prevent foreign matters of a sub-micron or less from adhering to an inside of a surface of a display, so there is a demand for the countermeasure against a non-lighting pixel.

On the other hand, it is known that such a non-lighting defect can be lit normally by burning out a short-circuited portion with a laser so as to insulate the short-circuited portion. However, it is difficult to find in which place of a pixel a short-circuited portion is present.

Japanese Patent Application Laid-Open No. 2004-199970 discloses a method of specifying the position of a heat generation portion caused by a short-circuit in a high-magnification field of view of an infrared temperature image detection microscope. However, according to the method, a step of laser repair (burning repair) is complicated and takes a long time, which increases the cost of one panel to a large extent.

As another method of burning repair, a method of repairing a short-circuited portion during aging is known. According to this method, in a manufacturing process of an organic EL device, aging processing of applying a voltage between an anode electrode and a cathode electrode is performed to open and break a film defective portion previously. The opening and breaking refers to making a defective portion non-conductive. The opening and breaking is considered to be caused by a phenomenon in which an electrode corresponding to a film defective portion is broken and opened (insulated) by Joule heat generated during aging or oxidized to be made non-conductive. The film defective portion subjected to the opening and breaking becomes a local non-light emitting state. However, the film defective portion is smaller than the whole pixels, so the film defective portion does not influence the quality of a display.

Japanese Patent Application Laid-Open No. 61-114493 discloses an aging method for an inorganic EL device as the method of performing opening and breaking by the aging. According to this method, a DC voltage is applied as a first aging step, whereby a defective portion present in a panel is broken in a small region.

Further, Japanese Patent No. 2,818,255 proposes the following method. That is, aging is performed such that an organic EL device is successively supplied with a DC forward voltage and a DC backward voltage, which are within a range of $1 \times 10^4$ to $1 \times 10^7$ (V/cm), for one second or longer, respectively, as a first aging step. After that, as a second aging step, a DC forward voltage is applied for a longer period of time than the first aging step.

Further, Japanese Patent No. 3,562,522 discloses a method in which a breakdown voltage of a defective portion and a breakdown voltage of an organic EL device are obtained, and then, an aging step is performed with a voltage range between the breakdown voltages being set to be a range of an applied voltage in the aging processing.

According to any of the above-mentioned methods, a voltage is applied to a normal pixel. Therefore, device degradation of a normal pixel is caused, which leads to inconvenience such as decrease in panel luminance and occurrence of display unevenness Further, in a case where a panel area is large, a current flowing through a panel increases. Therefore, power source wiring itself generates heat to be disconnected, and device degradation may be caused by the heat generation of a panel. Actually, it is difficult to apply the aging processing.

SUMMARY OF THE INVENTION

In view of the above-mentioned problems, it is an object of the present invention to provide an organic EL display apparatus capable of opening and breaking a defective portion of a pixel without degrading a normal portion thereof, and a method of producing the organic EL display apparatus.

In order to attain the above-mentioned object, according to an aspect of the present invention, there is provided a method of producing an organic EL display apparatus including a plurality of organic EL light emitting devices, including the steps of:

(1) forming the plurality of organic EL light emitting devices and a drive circuit for driving each of the organic EL light emitting devices on a substrate;

(2) measuring one of a light emission amount when a current is supplied from the drive circuit and a current amount with respect to application of a voltage of a polarity opposite to a polarity of light emission, with respect to each of the plurality of organic EL light emitting devices, and specifying an defective organic EL light emitting device in which one of the light emission amount and the current amount is unusual; and (3) repairing the defective organic EL device by supplying a current to the defective organic EL light emitting device from the drive circuit.

According to another aspect of the present invention, there is provided an organic EL display apparatus including:

a plurality of organic EL light emitting devices formed on a substrate;

a drive circuit for driving each of the organic EL light emitting devices;

a unit for applying a voltage of a polarity opposite to a polarity obtained during light emission, to each of the plurality of organic EL light emitting devices;

a unit for measuring an amount of a current flowing to the organic EL light emitting device applied with the voltage of the opposite polarity;

a unit for determining whether the measured current amount is unusual; and a unit for repairing the unusual device by supplying a current from the drive circuit to the organic EL light emitting device.

According to another aspect of the present invention, there is provided a method of repairing a defect of an organic EL display apparatus including a plurality of organic EL light emitting devices arranged therein, the method including the steps of:

detecting a position of an organic EL light emitting device having a short-circuited portion among the plurality of organic EL light emitting devices arranged thereon; and selectively supplying a current to the organic EL light emitting device provided at the detected position to break the short-circuited portion.

According to the present invention, after a defective portion is detected, a current is caused to flow through only the defective portion, so a normal pixel is not degraded. Further, a current flowing through a panel is suppressed greatly as compared with a case where a current is caused to flow through the whole pixels. Therefore, device degradation caused by the disconnection of power source wiring and the heat generation of a panel does not occur. Accordingly, the defective portion of the pixel can be opened and broken without degrading the normal portion thereof, and the defective pixel can be repaired within a shorter period of time as compared with that of laser repair, so costs hardly increase.

Further features of the present invention will become apparent from the following description of exemplary embodiments with reference to the attached drawings.

DESCRIPTION OF THE EMBODIMENTS

Hereinafter, a method of producing an organic EL display apparatus and an organic EL display apparatus according to the present invention will be described by way of embodiments with reference to the drawings.

Embodiment 1

Figure 1:
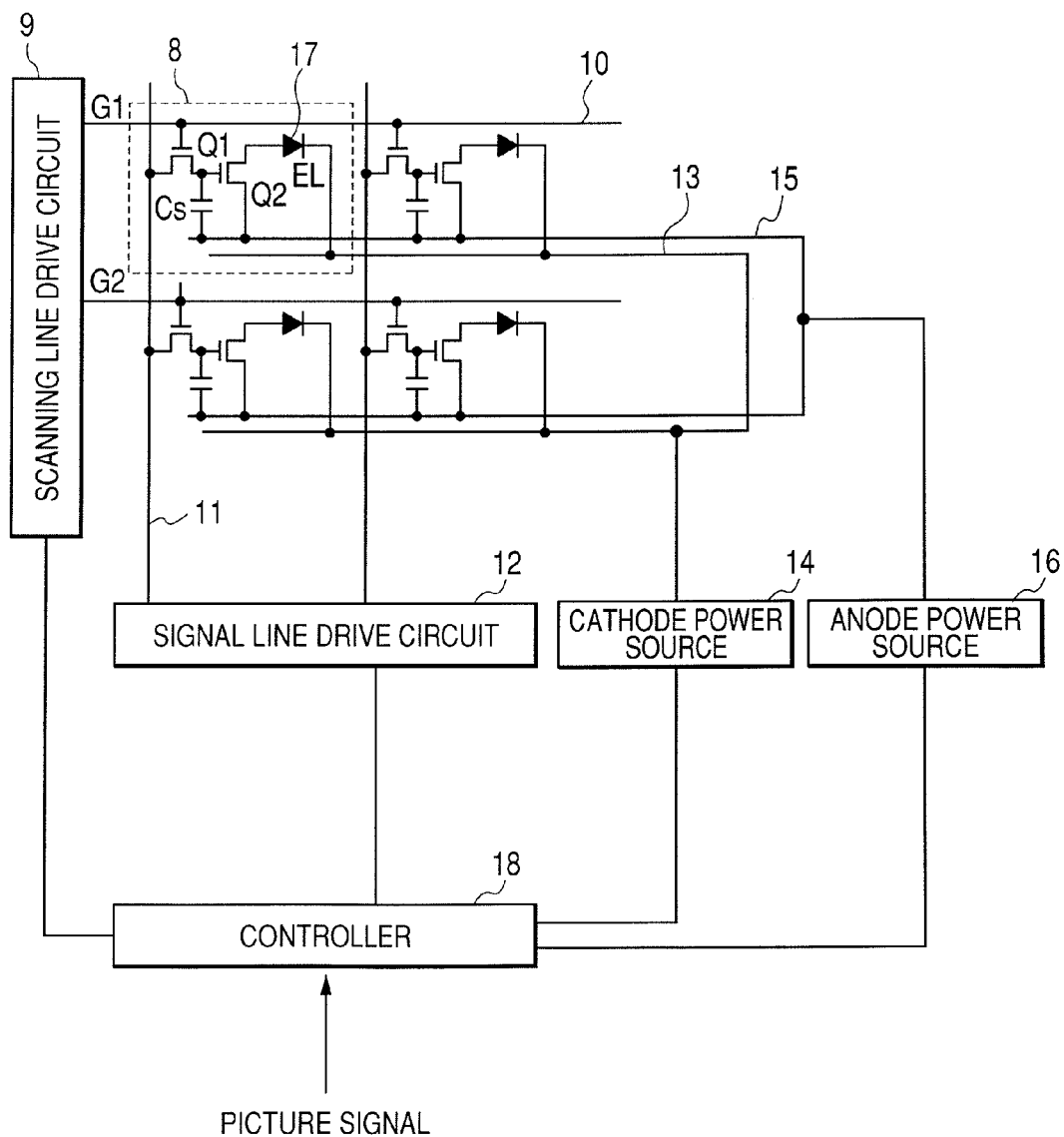
FIG. 1 is a block diagram illustrating a configuration of an organic EL display apparatus according to Embodiment 1 of the present invention.
Figure 2:
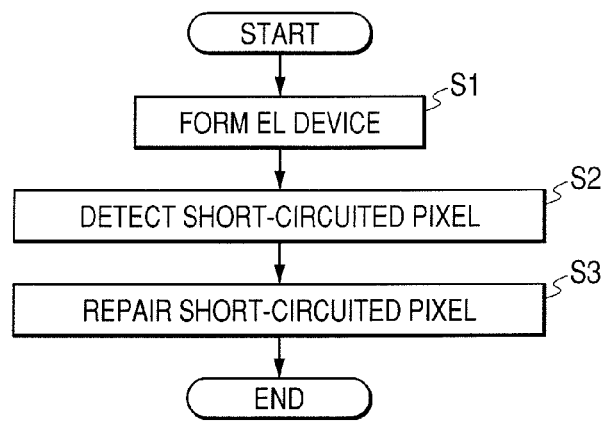
FIG. 2 is a flowchart schematically illustrating a method of producing an organic EL display apparatus according to Embodiment 1.

First, referring to FIGS. 1 to 5, Embodiment 1 of the present invention will be described. FIG. 1 is a block diagram illustrating an organic EL display apparatus according to this embodiment, and FIG. 2 is a flowchart schematically illustrating a production method thereof.

In the organic EL display apparatus illustrated in FIG. 1, in a pixel matrix array region on an insulating substrate (active matrix substrate), pixels 8 made of organic EL light emitting devices and drive circuits thereof are arranged in a matrix array. Each of the pixels 8 has a switching transistor (TFT) Q1 playing a role as a switch for selecting a pixel, a holding capacitor Cs, an operation transistor (TFT) Q2 supplying a current to an EL device, and an organic EL device 17. Further, on the insulating substrate (active matrix substrate), a plurality of scanning lines (gate lines) 10 is provided along a row direction, and a plurality of signal lines 11 is provided along a column direction. In the example illustrated in the figure, G1 denotes a scanning line 10 in the first row, and G2 denotes a scanning line 10 in the second row (third and subsequent rows are omitted). On the insulating substrate, further, a plurality of anode lines 15 is provided, for example, along the row direction as a voltage supply line of each pixel 8. On the insulating substrate, an anode electrode is formed, and on the anode electrode, an organic light emitting layer and a cathode electrode are formed successively. The anode electrode, the organic light emitting layer, and the cathode electrode constitute an organic EL device 17. The cathode electrode is connected to a cathode line 13, and has a potential common to all the pixels. The cathode electrode is also called a common electrode.

One end (anode side) of the organic EL device 17 is connected to the electrode on a drain side of the operation transistor Q2 formed on the active matrix substrate. Further, the other end (cathode side) of the organic EL device 17 is connected to a cathode power source 14 via a cathode line 13 in common to the respective pixels. Regarding the pixel selection transistor Q1, a gate is connected to the scanning line 10, a source is connected to the signal line 11, and a drain is connected to a gate of the operation transistor Q2 and one end of the holding capacitor Cs. A drain of the operation transistor Q2 is connected to one end of the organic EL device 17. Further, a source of the operation transistor Q2 is connected to the anode power source 16 via the anode line 15 in common to the respective pixels. The other end of the holding capacitor Cs is connected the anode power source 16 via the anode line 15 in common to the respective pixels.

In the pixel matrix array region, a plurality of scanning lines 10 is connected to a scanning line drive circuit (gate line drive circuit) 9, and a plurality of signal lines 11 is connected to a signal line drive circuit 12. The scanning line drive circuit 9 and the signal line drive circuit 12 can also be formed on the same substrate as that of the organic EL device. In this case, the scanning line drive circuit 9 and the signal line drive circuit 12 may be provided on the periphery of a display region formed by the respective pixels 8.

The scanning line drive circuit 9, the signal line drive circuit 12, the cathode power source 14, and the anode power source 16 are connected to a controller 18. The controller 18 is supplied with a picture signal, and based on the picture signal, the operations of the scanning line drive circuit 9, the signal line drive circuit 12, the cathode power source 14, and the anode power source 16 can be controlled.

Next, the operation of the organic EL display apparatus will be described.

First, when a picture signal is input to the controller 18, the input picture signal is converted into a signal for driving the organic EL display apparatus by the controller 18, and sent to the scanning line drive circuit 9 and the signal line drive circuit 12.

Then, based on a control signal such as a start signal sent from the controller 18, a scanning signal that turns on each scanning line 10 (G1, G2, . . . ) only during one horizontal scanning period (1 H) is supplied thereto from the scanning line drive circuit 9. Consequently, first, the pixel selection transistors Q1 in the first row are turned on simultaneously, and the pixel selection transistors Q1 in the second and subsequent rows are selected successively on the row basis.

On the other hand, a control voltage is supplied from the signal line drive circuit 12 to each signal line 11, and the holding capacitor Cs of each pixel 8 is charged with the control voltage via the pixel selection transistor Q1. When the holding capacitor Cs is charged, the operation transistor Q2 is turned on, which allows a current supplied from the anode electrode to flow to the organic EL device 17, whereby the pixel 8 is lit. The current flowing to the organic EL device 17 can be controlled by controlling the voltage with which the holding capacitor Cs is charged, so a multi-gradation display can be performed.

Next, a method of producing the organic EL display apparatus will be described with reference to FIG. 2.

The production method illustrated in FIG. 2 includes an EL device formation step, a defective pixel detection step, and a repair step.

First, in an EL device formation step (S1), scanning lines, signal lines, and transistors are formed on a glass substrate, and the organic EL devices 17 are formed thereon. Each organic EL device 17 is obtained by forming an anode electrode, a hole transporting layer, an organic light emitting layer, an electron injecting layer, and a cathode electrode successively.

After that, the organic EL device 17 is sealed with a sealing substrate made of glass and an organic resin, whereby water is prevented from entering the organic EL device 17. As a sealing method, a protective film such as a nitride silicon film may be formed. In this case, a sealing substrate is not necessary, and the thickness of the organic EL display apparatus can be reduced to be about a half.

After the above-mentioned step, in the defective pixel detection step (S2), the position of a pixel (short-circuited pixel) in which a cathode electrode and an anode electrode of the formed organic EL device 17 are short-circuited is detected.

In the subsequent repair step, a current is supplied from the drive circuit to the detected short-circuited pixel, whereby a defective portion is opened and broken (Step S3).

In the repair step, current detection and voltage application are repeated until opening and breaking occurs for each defective pixel. In this case, it is desirable that the potential of a voltage supply line or a common electrode be changed to increase the voltage between the voltage supply line and the common electrode gradually for each repetition. Alternatively, a voltage application time may be prolonged gradually. Opening and breaking occurs at a certain voltage value, and this step is completed.

Repair may be performed by continuing to apply a predetermined voltage higher than a normal operation voltage to all the pixels for a predetermined period of time (e.g., about 100 hours). The voltage and time in this case are set to be those sufficient for all the defective pixels to be opened and broken.

According to this embodiment, after the defective portion is detected, a current is allowed to flow to only the defective portion. Therefore, normal pixels are not degraded. Further, the current flowing to a panel during repair is suppressed greatly compared with the case where a current flows to all the pixels. Therefore, a device is not degraded due to the disconnection of power source wiring and the heat generation of a panel. Thus, the defective portion can be opened and broken without degrading normal portions of pixels, and repair can be performed within a shorter period of time compared with laser repair, so a cost hardly increases.

Further, in the case where a defective pixel is detected electrically, a defect of a drive circuit is discriminated from a defect of an organic EL device, and only the defect of the organic EL device can be detected by the method described later.

Further, according to an electrical detection method, a detection time can be shortened compared with a technological detection method, and a repair step and a defective pixel detection step are repeated, whereby an organic EL display apparatus without a defective pixel can be produced easily.

Further, a short-circuited portion can be passivated easily by adopting any one of Ag, Mg, and Al as a cathode electrode, so the time of the repair step can be shortened greatly. Further, even if the size of a transistor in a pixel circuit is small, the defective pixel can be repaired sufficiently, so the definition of the pixel can be increased.

The defective pixel detection step and the repair step may be performed in any one of the subsequent production steps, as long as those steps are performed after the cathode film formation of the organic EL display apparatus. However, it is desirable that those steps are performed after sealing, considering the production ease.

After the defect is repaired as described above, a voltage is applied to all the pixels including normal pixels for a predetermined period of time, whereby aging is performed.

The aging is performed in order to average the variation in characteristics immediately after the production and to stabilize the characteristics of each pixel. In order to perform the aging within a short period of time, a change in characteristics is accelerated by applying a voltage higher than a driving voltage. The voltage applied for the above-mentioned repair is applied as it is to all the pixels, whereby aging can be performed subsequently to the repair step. Alternatively, the aging may be performed within a shorter period of time by further increasing an applied voltage compared with that during repair.

In the present invention, a defective pixel is repaired by supplying a current selectively, so a current does not flow to normal pixels during the repair step. Further, in the repaired pixel, a current hardly flows in a portion other than the short-circuited portion. Consequently, the normal pixels and the repaired pixel are subjected to substantially the same current history, and aging is performed under the same initial conditions. Thus, the effect of aging is not varied between the normal pixels and the repaired pixel, and organic EL devices with uniform characteristics can be obtained after aging.

Figure 3:
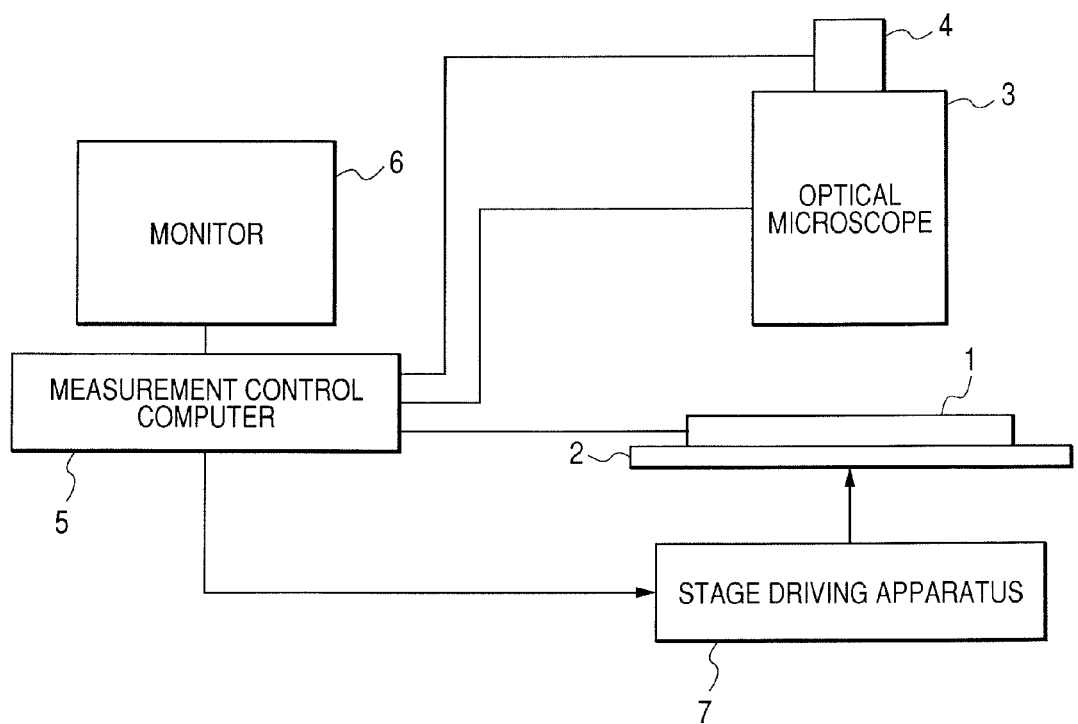
FIG. 3 is a schematic diagram of an inspection apparatus used in the method of producing an organic EL display apparatus according to Embodiment 1.
Figure 4:
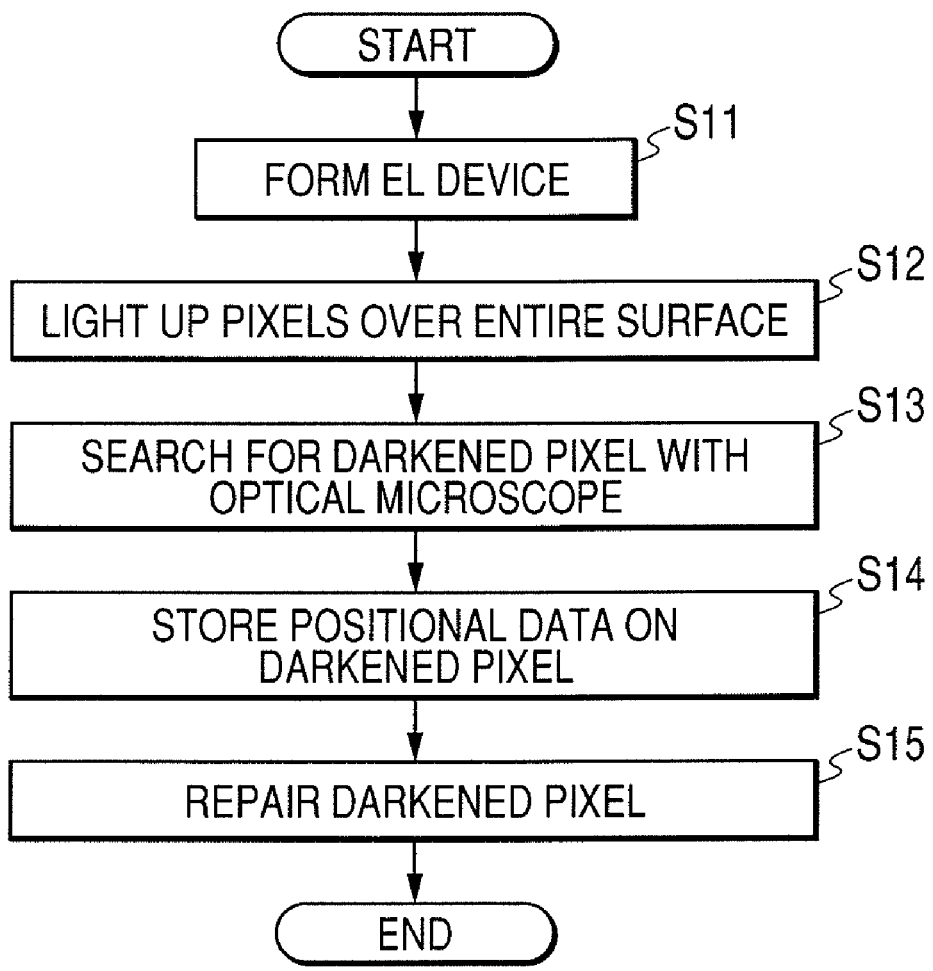
FIG. 4 is a flowchart schematically illustrating a production method using the inspection apparatus illustrated in FIG. 3.

FIG. 3 is a schematic diagram of an inspection apparatus serving as a repair apparatus used in the defective pixel detection step and the repair step in the above-mentioned production method, and FIG. 4 is a flowchart illustrating a production method using the inspection apparatus.

The inspection apparatus illustrated in FIG. 3 includes an XY stage 2 on which the organic EL display apparatus 1 is placed, an optical microscope 3 placed at a position opposed to the organic EL display apparatus 1 on the XY stage 2, and a CCD camera 4 serving as an image pickup apparatus attached to the optical microscope 3. Further, the inspection apparatus includes a stage driving apparatus 7 for driving the XY stage 2, a measurement control computer 5 connected to the optical microscope 3, the CCD camera 4, and the stage driving apparatus 7, and a monitor 6 connected to the measurement control computer 5.

In the above-mentioned inspection apparatus, the organic EL display apparatus 1 is placed on a movement mechanism made of the XY stage 2, and a lighting state of a pixel can be observed with optical means, specifically, the optical microscope 3. The optical microscope 3 is provided with the CCD camera 4, and sends an image observed by the CCD camera 4 to the measurement control computer 5 as imaging data. The monitor 6 is connected to the measurement control computer 5, and the imaging data sent from the CCD camera 4 is displayed on the monitor 6 as an observed image. The stage driving apparatus 7 is controlled by the measurement control computer 5 to drive the XY stage 2, thereby aligning an arbitrary position on a display surface of the organic EL display apparatus 1 with an optical axis of the optical microscope 3.

Next, a method of producing an organic EL panel will be described with reference to FIG. 4.

First, an organic EL device and a drive circuit thereof are formed in the same EL device formation step as that described above (Step S11).

After that, the process proceeds to the defective image detection step and the repair step using the inspection apparatus illustrated in FIG. 3. At this time, first, the organic EL display apparatus 1 in which an organic EL device is formed is fixed on the XY stage 2, and an origin and a coordinate axis of the organic EL display apparatus 1 are set. At this time, the drive scanning of the XY stage 2 and the setting of origin data are performed by the measurement control computer 5 via the stage driving apparatus 7.

Then, the measurement control computer 5 sends a control signal to the controller 18. Thus, the drive circuit of each pixel supplies a lighting (white display) predetermined current to the organic EL device, thereby lighting the entire surface of the organic EL display apparatus 1 (Step S12). In this state, the panel display surface of the organic EL display apparatus 1 is scanned with the optical microscope 3, and a defective pixel (darkened pixel) that is not lit on the panel display surface is searched from an image displayed on the monitor 6 (Step S13). The optical microscope 3 detects the light emission amount of each pixel, and stores the coordinate of an unusual pixel with a light emission amount smaller than a predetermined light emission amount.

Herein, a darkened pixel can be captured in a field of view divided into a plurality of portions automatically by sending a driving signal to the stage driving apparatus 7 so that a search is performed successively from the measurement control computer 5, for example. Further, the measurement control computer 5 can specify a darkened pixel by image processing, and stores positional data of the specified darkened pixel (Step S14). By repeating the operation, the lighting state of the entire surface of the display region can be inspected, and positional data of a darkened pixel is stored.

Next, the measurement control computer 5 creates an image pattern which sets a normal pixel in a non-lighting state and a darkened pixel in a lighting state, from the obtained positional data on a darkened pixel, and sends a picture signal corresponding to the image pattern to the organic EL display apparatus 1. Then, in the organic EL display apparatus 1, the controller 18 controls so that a current flows to only the darkened pixel among the respective pixels, and this state is maintained, whereby only the darkened pixel can be repaired selectively (Step S15).

The detection step and the repair step of the darkened pixel may be performed in any one of the subsequent production steps, as long as those steps are performed after the cathode film formation of the organic EL display apparatus 1, and are desirably performed after sealing, considering the production ease.

Thus, according to the method of producing an organic EL display apparatus described above, a current is allowed to flow to only a pixel defective portion selectively, so normal pixels are not degraded. Further, a current flowing to a panel can be suppressed greatly compared with the case where a current flows to all the pixels. Therefore, a device is not degraded by the disconnection of power source wiring and the heat generation of a panel. Thus, a defective portion can be opened and broken without degrading normal portions of the pixels, and a defective pixel can be repaired within a shorter period of time compared with laser repair, so a cost hardly increases.

Figure 5:
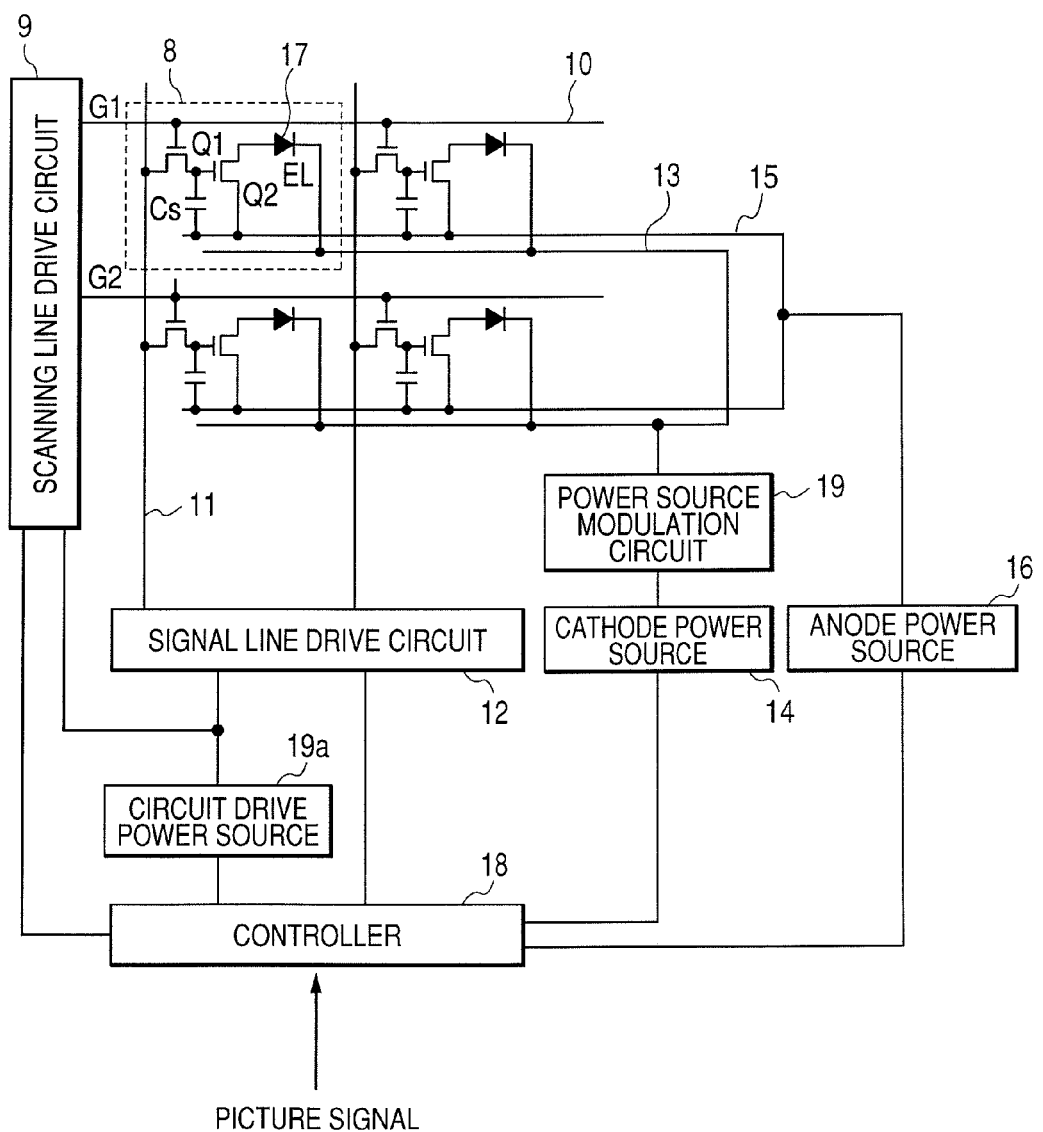
FIG. 5 is a block diagram illustrating a configuration of an organic EL display apparatus in a case of modulating a cathode power source of the organic EL display apparatus according to Embodiment 1.

In this embodiment, by modulating the anode voltage or the cathode voltage during repair of a defective pixel to increase the potential difference between the anode and cathode, the current flowing to the defective pixel can be further increased, and a time required for repair can be further shortened. In this case, in order to modulate the anode voltage or the cathode voltage, a power source modulation circuit may be provided in addition to the configuration of the organic EL display apparatus illustrated in FIG. 1. FIG. 5 shows an exemplary configuration of the organic EL display apparatus in the case of modulating the cathode voltage. The same reference numerals as those in FIG. 1 denote the same members as those therein.

Further, the cathode electrode is generally formed over the entire surface of the display region of the organic EL display apparatus as a common electrode, and is supplied with 0 V. Further, as a potential of a circuit driving power source 19a of the scanning line drive circuit 9 and the signal line drive circuit 12, 0 V is input from the controller 18. Thus, in order to modulate the cathode voltage, it is necessary that the circuit driving power source 19a of the scanning line drive circuit 9 and the signal line drive circuit 12, and the cathode power source 14 be connected independently, as illustrated in FIG. 5.

Further, as the cathode electrode, a metal thin film of Ag, Mg, or Al may be used. In this case, a short-circuited portion is likely to be oxidized and passivated, so a defective pixel can be made normal sufficiently even if the current supply ability of the driving transistor Q2 of the organic EL device is small Consequently, even in a high-definition pixel with the small driving transistor Q2, a defective pixel can be repaired sufficiently.

Embodiment 2

Next, referring to FIGS. 6 to 8, Embodiment 2 of the present invention will be described.

In this embodiment, a method of electrically detecting a defective pixel will be described without using an optical microscope in a defective pixel detection step, unlike Embodiment 1.

Figure 6:
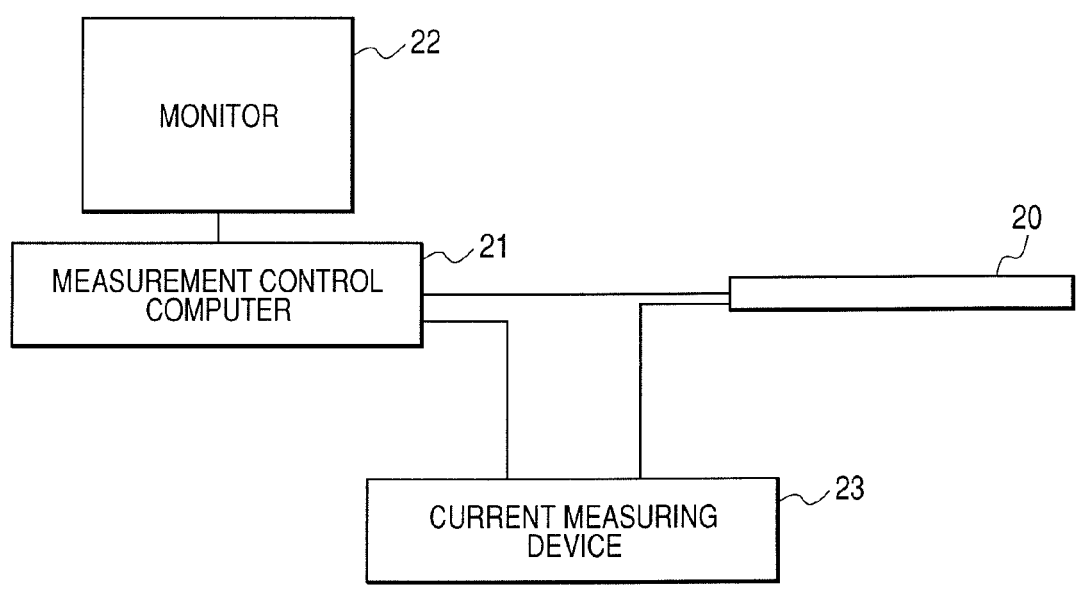
FIG. 6 is a schematic diagram of an inspection apparatus used in a method of producing an organic EL display device according to Embodiment 2 of the present invention.

FIG. 6 is a schematic diagram of an inspection apparatus serving as a repair apparatus used in a step of specifying a defective pixel and a repair step in the method of producing an organic EL display apparatus according to this embodiment. FIG. 7 is a flowchart schematically illustrating a production method using the inspection apparatus. The configuration of the organic EL display apparatus of this embodiment is the same as that of Embodiment 1, so the description thereof will be omitted.

The inspection apparatus illustrated in FIG. 6 includes a measurement control computer 21 and a monitor 22 connected to an organic EL display apparatus 20, and a current measuring unit 23 connected to the organic EL display apparatus 20 and the measurement control computer 21. The current measuring unit 23 is connected to an anode power source (see FIGS. 1 and 5) of the organic EL display apparatus 20, measures a current flowing to an anode electrode, and sends a measured value to the measurement control computer 21.

Figure 7:
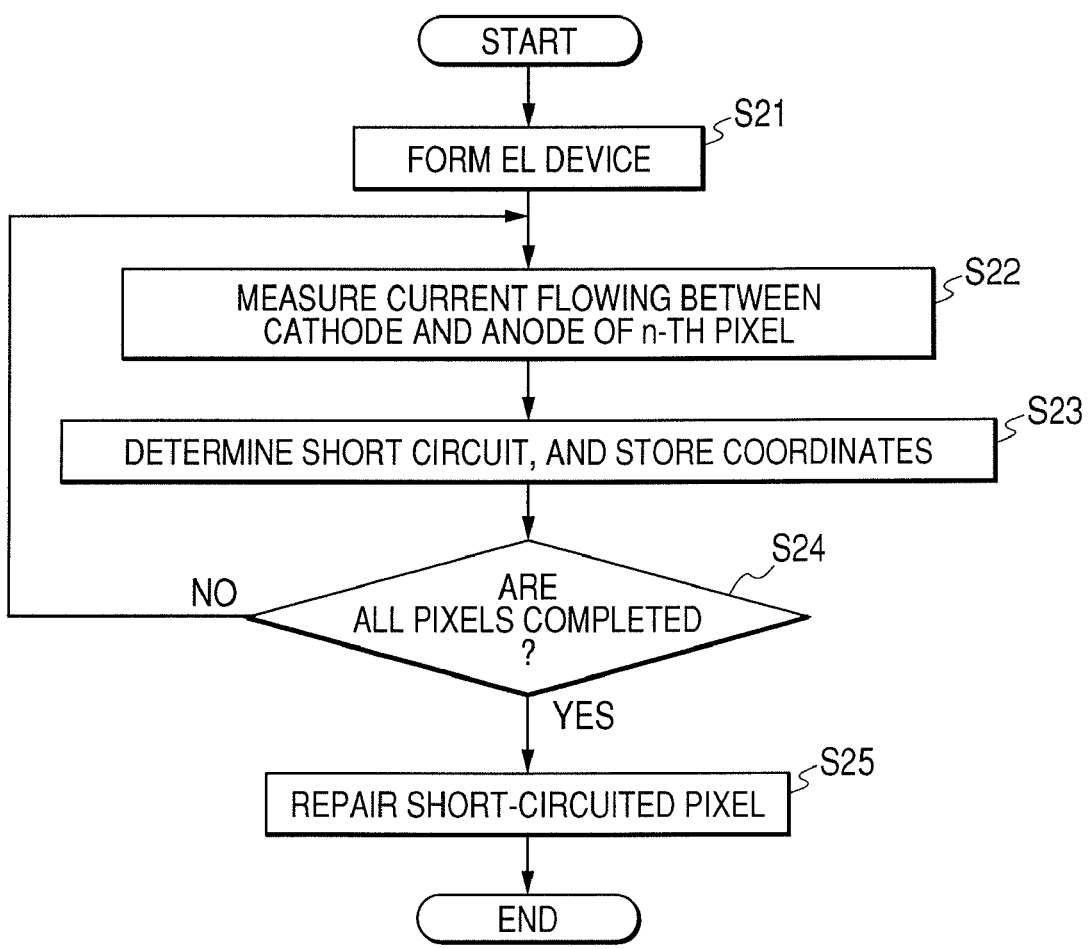
FIG. 7 is a flowchart schematically illustrating the method of producing an organic EL display apparatus according to Embodiment 2.

In FIG. 7, first, an organic EL device 17 is formed in the same EL device formation step as that described above (Step S21). After that, the process proceeds to the defective pixel detection step and the repair step using the inspection apparatus illustrated in FIG. 6. At this time, first, as illustrated in FIG. 6, the organic EL display apparatus 20 is connected to the measurement control computer 21 and the current measurement unit 23.

Then, the current measuring unit 23 measures the amount of a current flowing from a cathode to an anode by applying a voltage of a polarity opposite to that of light emission to one pixel (assumed to be an n-th pixel) of the organic EL display apparatus 20 (Step S22). Then, the measurement control computer 21 determines whether or not the n-th pixel is short-circuited based on the measured value, and stores positional data (coordinate value) of the short-circuited pixel (Step S23). After that, the operations performed in Steps S22 and S23 are repeated until the determination of a short-circuit is performed with respect to all the pixels (Step S24). After the determination of a short-circuit of all the pixels is completed, the measurement control computer 21 creates an image pattern that sets only the short-circuited pixel in a lighting state selectively, from the obtained positional data of the short-circuited pixel. Then, a picture signal corresponding to the image pattern is sent to the organic EL display apparatus 20. Then, in the organic EL display apparatus 20, a current flows to only the short-circuited pixel, and this state is maintained, whereby only the short-circuited pixel can be repaired selectively (Step S25).

Figure 8:
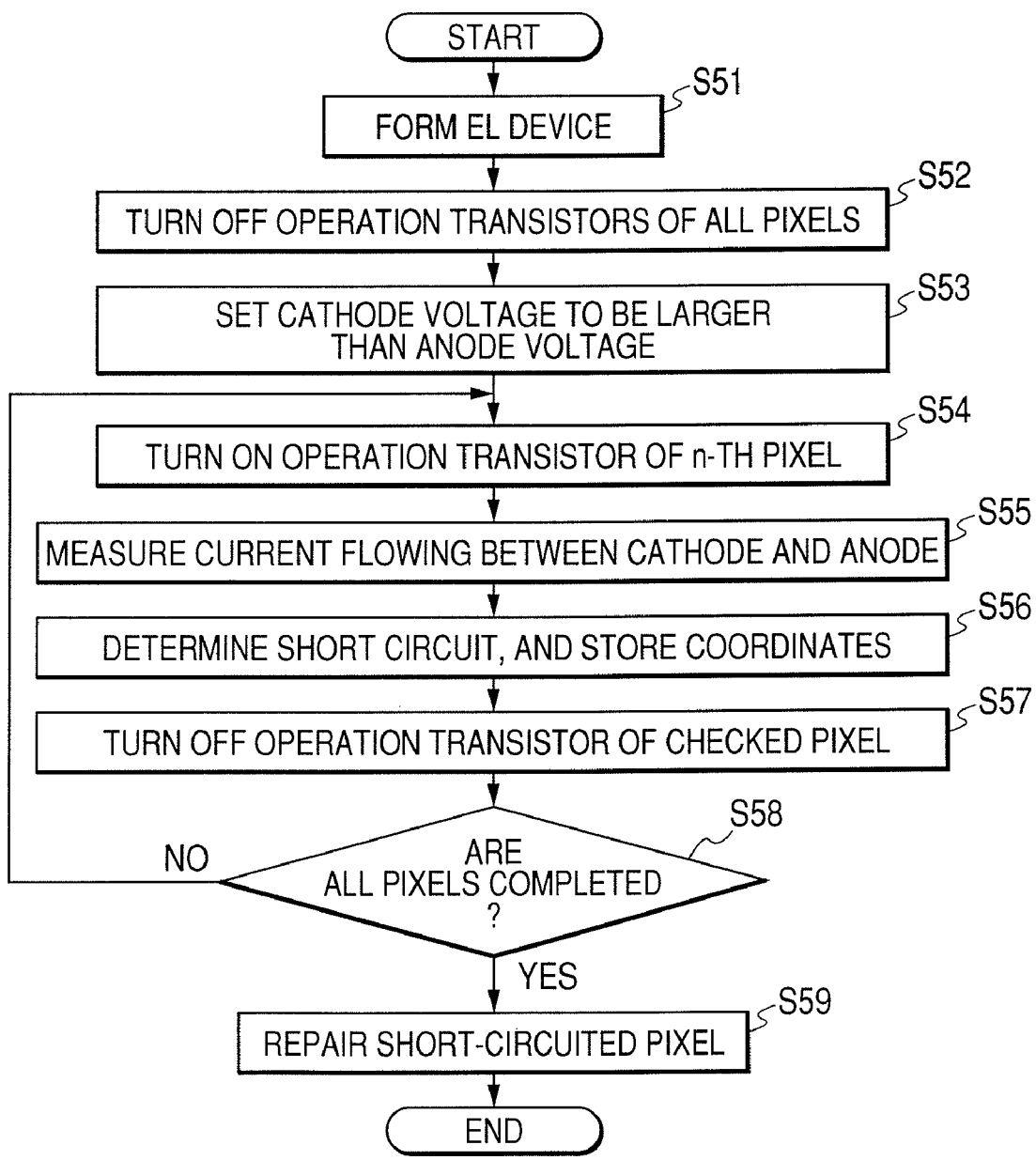
FIG. 8 is a flowchart illustrating details of the method of producing an organic EL display apparatus according to Embodiment 2.

FIG. 8 is a flowchart illustrating the detail of the above-mentioned production method.

In FIG. 8, an organic EL device 17 is formed in the same EL device formation step as that described above (Step S51). After that, as illustrated in FIG. 6, the organic EL display apparatus 20 is connected to the measurement control computer 21 and the current measuring unit 23.

After that, the measurement control computer 21 sends a picture signal to the organic EL display apparatus 20, and the organic EL display apparatus 20 writes a control voltage by using the controller 18 in the holding capacitors Cs via the signal lines 11 so that the operation transistors Q2 of all the pixels are turned off (Step S52). Then, the organic EL devices 17 of all the pixels 8 are set to be in a non-lighting state.

Next, the controller 18 brings the cathode potential close to the potential side of the voltage supply line. That is, the controller 18 changes the cathode potential in a direction higher than that during light emission (Step S53).

In this state, the controller 18 writes a control voltage only in one pixel with respect to the n-th pixel, thereby turning on the operation transistor Q2 (Step S54). Then, the cathode potential of the organic EL device 17 becomes higher than the anode potential, and is supplied with a voltage (reverse bias) in a direction opposite to that during light emission.

In the case where the organic EL device 17 is normal, there is rectification, so a current does not flow between the anode electrode and the cathode electrode even at a reverse bias. However, when the anode electrode and the cathode electrode are short-circuited, a current flows in a direction opposite to that during light emission.

The current measuring unit 23 measures the current (Step S55). The measurement result is sent to the measurement control computer 21.

Consequently, the measurement control computer 21 determines the target n-th pixel to be a defective pixel, by determining the case where the amount of a current in a direction opposite to that during light emission at a time of a reverse bias is larger than a predetermined amount to be unusual. In the case where a short-circuit is found as a result of the determination of a defect, the measurement control computer 21 stores the positional data (coordinate value) of the short-circuited pixel (Step S56).

After the determination of a defect with respect to the n-th pixel, the measurement control computer 21 sends a control signal to the organic EL display apparatus 20, and the controller 18 turns off the operation transistor Q2 (Step S57). After that, the above-mentioned operation is repeated until the determination of a defect with respect to all the pixels is completed (Step S58). Thus, the lighting state of an entire display region surface can be detected.

Next, the measurement control computer 21 creates an image pattern which sets a normal pixel in a non-lighting state and a defective pixel in a lighting state, from the obtained positional data on the defective pixel, and sends a picture signal corresponding to the image pattern to the controller 18. Then, in the organic EL display apparatus 20, a current flows to only the defective pixel in which a short-circuit has been detected, and this state is maintained, whereby only the defective pixel can be repaired (Step S59).

Even in such a method of producing an organic EL display apparatus, the same effect as that in Embodiment 2 can be obtained. Further, an optical microscope, a CCD camera, an XY stage, and a stage driving apparatus are not required, which is different from Embodiment 2. Therefore, the configuration of the inspection apparatus is simplified to reduce a cost, and in addition, the movement time of the XY stage is eliminated, so the inspection time can be shortened greatly.

In this embodiment, the case where an anode current is measured in the defective pixel detection step has been described. The same effect can also be obtained in the case where the current measuring unit is connected to the cathode power source to measure the cathode current.

Further, the circuits for detecting a defective pixel, i.e., a current measuring circuit 61, an anode supply voltage modulation circuit 64, a cathode supply voltage modulation circuit 63, and a controller 62 for controlling those circuits may be contained in a display apparatus. The anode supply voltage modulation circuit 64 and the cathode supply voltage modulation circuit 63 also function as circuits for repairing a defective pixel.

Embodiment 3

Figure 9:
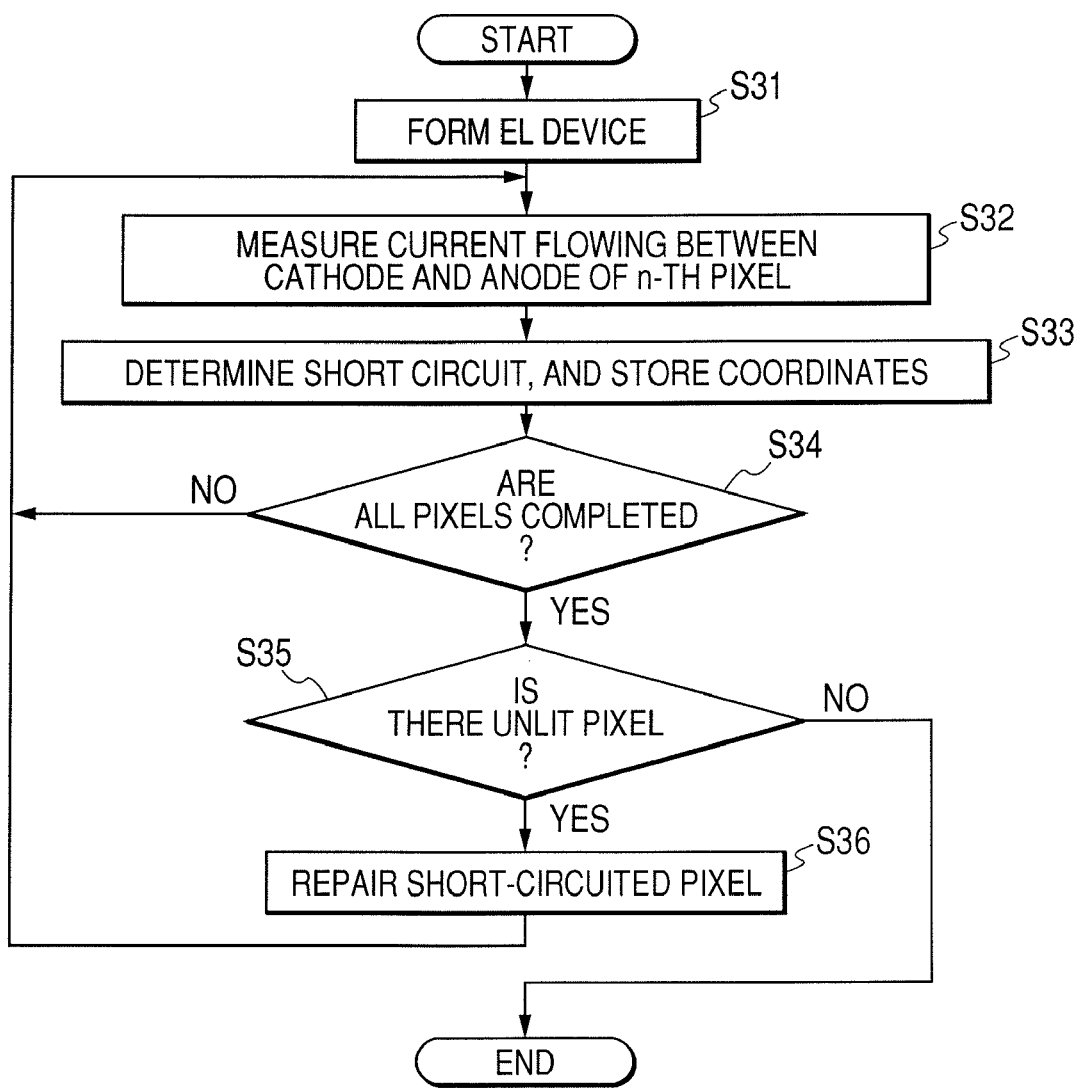
FIG. 9 is a flowchart schematically illustrating a method of producing an organic EL display apparatus according to Embodiment 3 of the present invention.

Next, referring to FIG. 9, Embodiment 3 of the present invention will be described. FIG. 9 is a flowchart schematically illustrating a method of producing an organic EL display apparatus according to this embodiment. The configuration of the organic EL display apparatus of this embodiment is the same as that in Embodiment 1 except for a repair method.

In FIG. 9, after an EL device is formed in the same way as described above (Step S31), a current is allowed to flow between a cathode electrode and an anode electrode of an n-th pixel (Step S32). A defect is determined based on the measurement results, and the positional data (coordinate value) of a short-circuited pixel is stored (Step S33). This operation is repeated until the determination of a defect with respect to all the pixels is completed (Step S34). After that, a voltage is applied to the short-circuited pixel for a predetermined period of time, thereby repairing the short-circuited pixel. After that, the lighting state of the short-circuited pixel is inspected and determined again (Step S35) If there is a short-circuited pixel, a voltage is applied to the short-circuited pixel for a predetermined period of time to repair the short-circuited pixel (Step S36).

Thus, according to such a production method, until all the short-circuited pixels are lit, repair can be performed easily. Further, in Embodiment 3, there is a fear that a lit pixel may degrade luminance. However herein, the degradation in luminance can be minimized by shortening a repair time and increasing the frequency of a short-circuit inspection.

Embodiment 4

Figure 10:
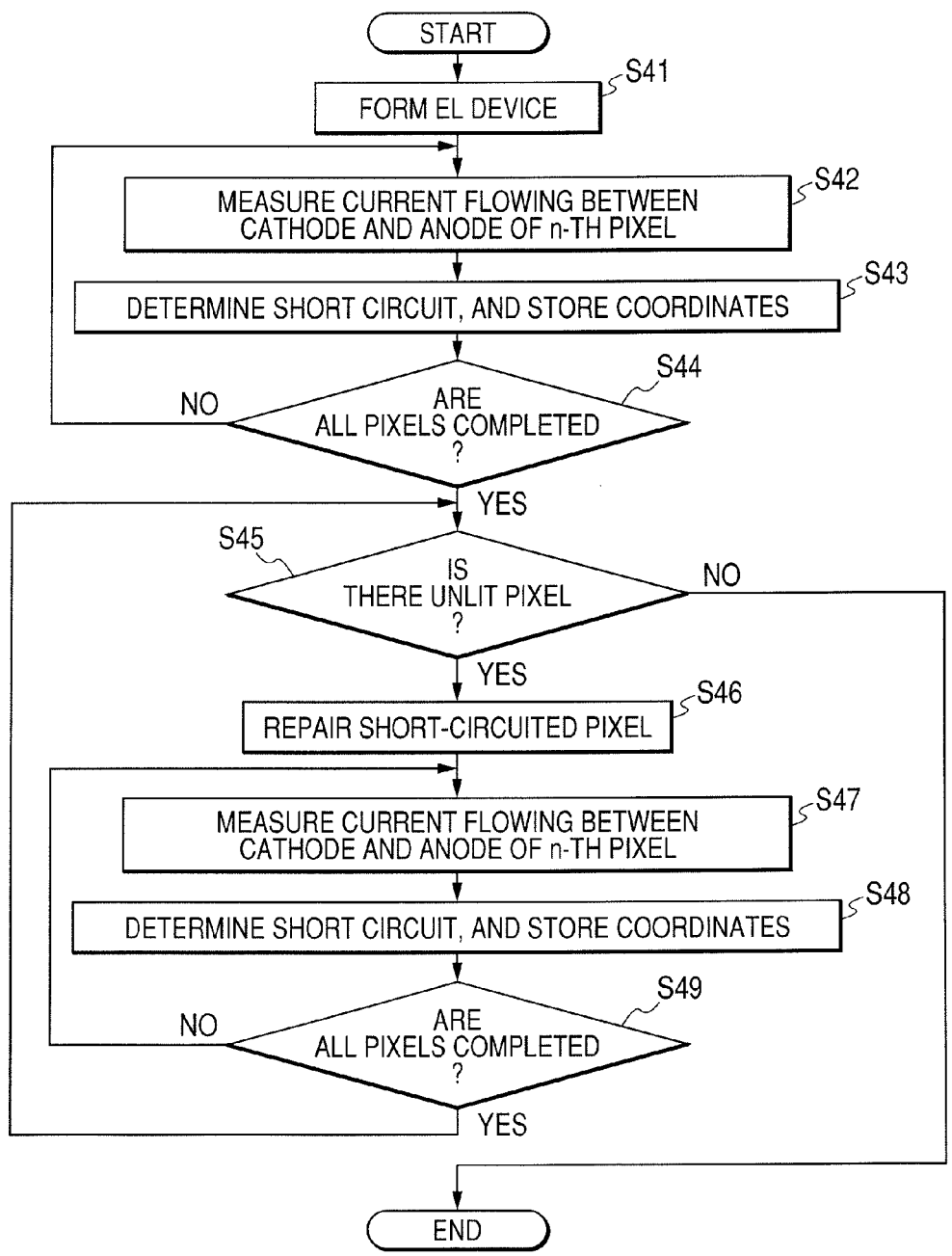
FIG. 10 is a flowchart schematically illustrating a method of producing an organic EL display apparatus according to Embodiment 4 of the present invention.

Next, referring to FIG. 10, Embodiment 4 of the present invention will be described. FIG. 10 is a flowchart schematically illustrating a method of producing an organic EL display apparatus according to this embodiment. The configuration of the organic EL display apparatus according to this embodiment and a production method thereof are the same as those in Embodiments 1 to 3 except for a repair method.

In FIG. 10, after an EL device is formed in the same way as described above (Step S41), a current is allowed to flow between a cathode electrode and an anode electrode of an n-th pixel (Step S42). A defect is determined based on the measurement results, and positional data of a short-circuited pixel is stored (Step S43). This operation is repeated until the determination of a defect with respect to all the pixels is completed (Step S44). After that, a voltage is applied to the short-circuited pixel for a predetermined period of time, thereby repairing the short-circuited pixel. After that, the inspection and determination of a short-circuited pixel are performed again (Step S45), and if there is a short-circuited pixel, a voltage is applied to the short-circuited pixel for a predetermined period of time to repair the short-circuited pixel (Step S46).

After that, a current is allowed to flow between the cathode electrode and the anode electrode of the n-th pixel (Step S47). A defect is determined based on the measurement results, and positional data on a short-circuited pixel is stored (Step S48). This operation is repeated until the determination of a short-circuit with respect to all the pixels is completed (Step S49).

Thus, according to the production method, the inspection of a short-circuit after repair is performed only with respect to the short-circuited pixel, so the number of the inspections of a short-circuit can be suppressed. Thus, the degradation in a device due to the inspection of a short-circuit and the repair processing of a defective pixel can be minimized. Therefore, the yield of an organic EL display apparatus can be further enhanced.

Embodiment 5

Next, Embodiment 5 of the present invention will be described with reference to FIGS. 11 to 13.

In Embodiments 1 to 4 as described above, an organic EL display apparatus with a pixel circuit configuration of a voltage setting system has been exemplified. However, in this embodiment, the case of a pixel circuit of a current setting system will be described. According to the voltage setting system, display unevenness is likely to occur due to the variation in characteristics of TFTs. However, the current setting system is known as a system which is unlikely to be influenced by the variation in characteristics of TFTs and has less display unevenness.

Figure 11:
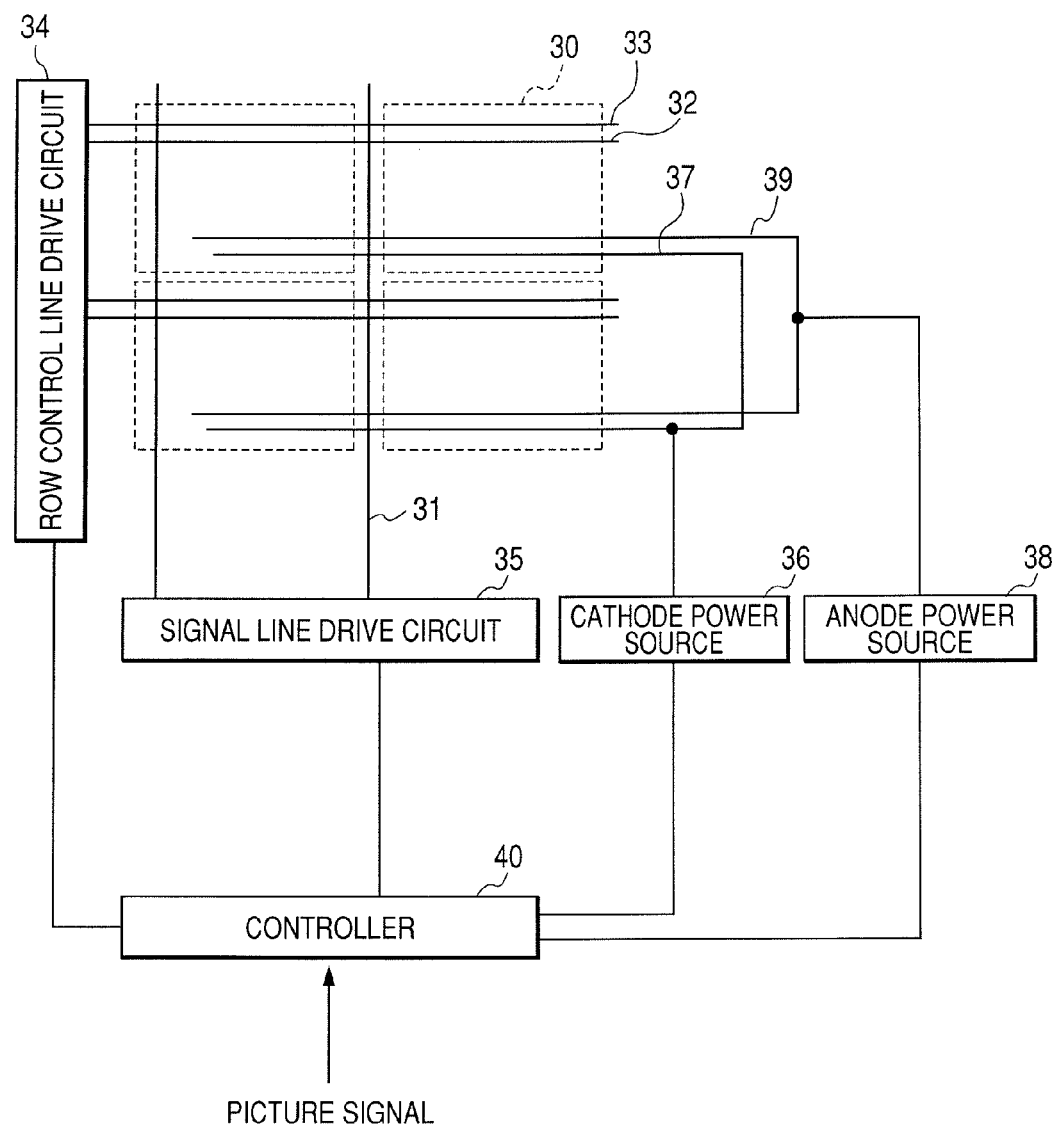
FIG. 11 is a block diagram illustrating a configuration of an organic EL display apparatus according to Embodiment 5 of the present invention.

FIG. 11 is a block diagram illustrating a configuration of an organic EL display apparatus according to this embodiment. FIG. 12 is a circuit diagram illustrating a configuration of a pixel circuit in the pixel. FIG. 13 is a timing chart illustrating the operation of the pixel circuit.

In the organic EL display apparatus illustrated in FIG. 11, in a pixel matrix array region, a plurality of pixels 30 is arranged in a matrix array. Each of the plurality of pixels 30 is connected to a row control line drive circuit 34 via two row control lines 32 and 33, connected to a signal line drive circuit 35 via a signal line 31, connected to a cathode power source 36 via a cathode line 37, and an anode power source 38 via an anode line 39. The row control line drive circuit 34, the signal line drive circuit 35, the cathode power source 36, and the anode power source 38 are connected to a controller 40 to which a picture signal is input, whereby each operation is controlled.

Figure 12:
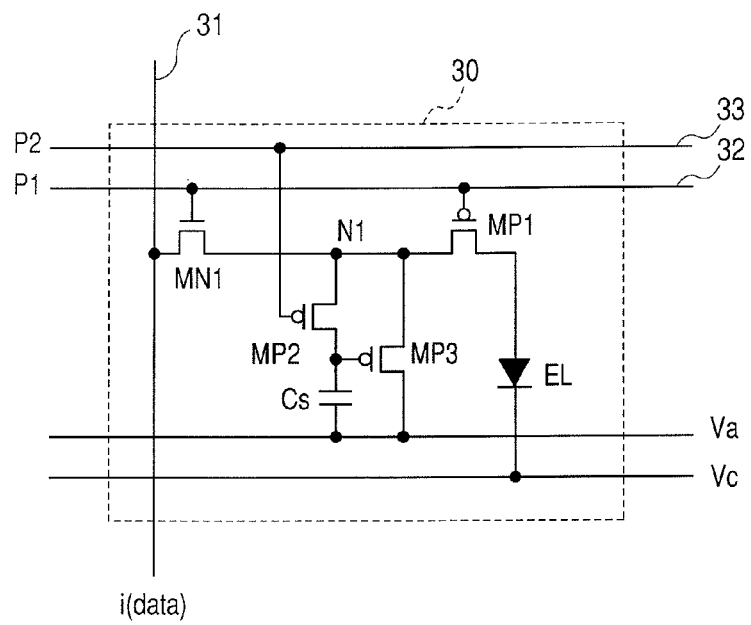
FIG. 12 is a pixel circuit diagram of the organic EL display apparatus according to Embodiment 5.
Figure 13:
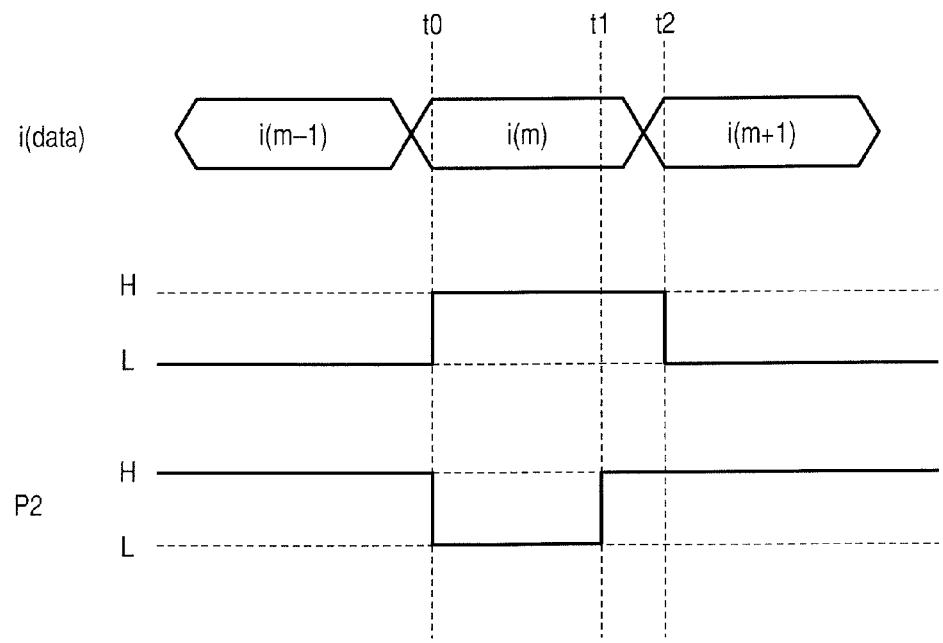
FIG. 13 is a timing chart illustrating an operation of a pixel circuit illustrated in FIG. 12.

The pixel circuit illustrated in FIG. 12 corresponds to one pixel 30. The pixels 30 are arranged in a matrix array as illustrated in FIG. 11. In the pixel circuit illustrated in FIG. 12, P1 and P2 correspond to row control signals (scanning signals) input from the row control line drive circuit 34 to the row control lines 32 and 33. i(data) corresponds to a current signal as a column control signal input from the signal line drive circuit 35 to the signal line 31. EL denotes an organic EL device, MP1, MP2, and MP3 denote P-type TFTs, MN1 denotes an N-type TFT, and Cs denotes a holding capacitor. N1 denotes a node connecting a drain of MN1, a source of MP1, and a drain of MP2.

An anode electrode of the organic EL device is connected to the drain of the MP1, and a cathode electrode thereof is connected to a cathode potential Vc. A gate electrode of the MP1 is connected to the row control line P1, a drain electrode thereof is connected to the anode electrode of the organic EL device, and a source electrode thereof is connected to a drain electrode of the MP3 and the node N1. A gate electrode of the MP2 is connected to the row control line P2, a drain electrode thereof is connected to the node N1, and a source electrode thereof is connected to a gate electrode of the MP3 and one end of the holding capacitor Cs. The gate electrode of the MP3 is connected to the source electrode of the MP2 and one end of the holding capacitor Cs, a source electrode thereof is connected to an anode potential Va, and a drain electrode thereof is connected to the source electrode of the MP1 and the node N1. A gate electrode of the MN1 is connected to the row control line P1, a source electrode thereof is connected to the current signal i(data) of the signal line 31, and a drain electrode thereof is connected to the node N1. One end of the holding capacitor Cs is connected to the source electrode of the MP2 and the gate electrode of the MP3, and the other end thereof is connected to the anode potential Va.

Next, the operation of the pixel circuit in the pixel 30 will be described with reference to the timing chart of FIG. 13. In FIG. 13, i(m−1), i(m), i(m+1) denote current signals i(data) input to the pixel circuit of the corresponding row of an m−1 row (one row before), an m row (corresponding row), and an m+1 row (one row after), respectively.

First, before a time t0, the P1 and P2 in the corresponding m row are at an L level and an H level, respectively. Therefore, the MN1 and MP2 are both in an OFF state, and the MP1 is in an ON state. In this state, because the MN1 is not in a conducting state, the current signal i(m−1) of one row before does not flow to the pixel circuit of the corresponding m row.

Then, at the time T0, P1 and P2 of the corresponding m row change to the H level and the L level, respectively. At this time, the MN1 and the MP2 are turned on, and the MP1 is turned off. In this state, the MN1 is in an ON state, so i(m) corresponding to the current data i(data) of the corresponding m row is input to the pixel circuit of the corresponding m row. A voltage in accordance with the current driving ability of the MP3 is generated by the input current signal i(m) in the holding capacitor Cs placed between the gate electrode of the MP3 and the anode supply potential Va. At this time, the MP1 is not in a conducting state, so a current does not flow to the organic EL device.

Then, at a time t1, a signal at the H level is input to the P2, and the MP2 is turned off. Then, the voltage of the holding capacitor Cs set (programmed) by the current signal i(m) is held. Further, at a time t2, a signal at the L level is input to the P1, and the MN1 is turned off and the MP1 is turned on. In this state, the pixel circuit of the corresponding m row is cut from the current signal i(data). Then, the MP1 is in a conducting state, so a source/drain current in accordance with the current driving ability of the MP3 is supplied to the organic EL device via the MP1 with the voltage generated by the current signal i(m) in the holding capacitor Cs. Consequently, the organic EL device emits light with luminance in accordance with the current signal i(m) supplied to the pixel circuit of the corresponding m row. This state is continued until the MN1 is turned on again.

Thus, even in the organic EL display apparatus of a current setting (programming) system as in this embodiment, a non-lighting pixel can be detected in the same way as in Embodiments 1 to 4, and the same effects as those therein are obtained. Further, when a defective pixel is repaired, if a current is set so that the gate potential of the MP3 of the defective pixel becomes a negative potential, a current flowing between the source and the drain of the MP3 further increases, so the defective pixel can be repaired within a short period of time. Further, by modulating the output voltage Vc of the cathode power source 36 and the output voltage Va of the anode power source 38 to increase a potential difference between the anode and the cathode, the repair time of the defective pixel can be shortened.

Embodiment 6

Next, Embodiment 6 of the present invention will be described with reference to FIGS. 14 to 18.

Figure 14:
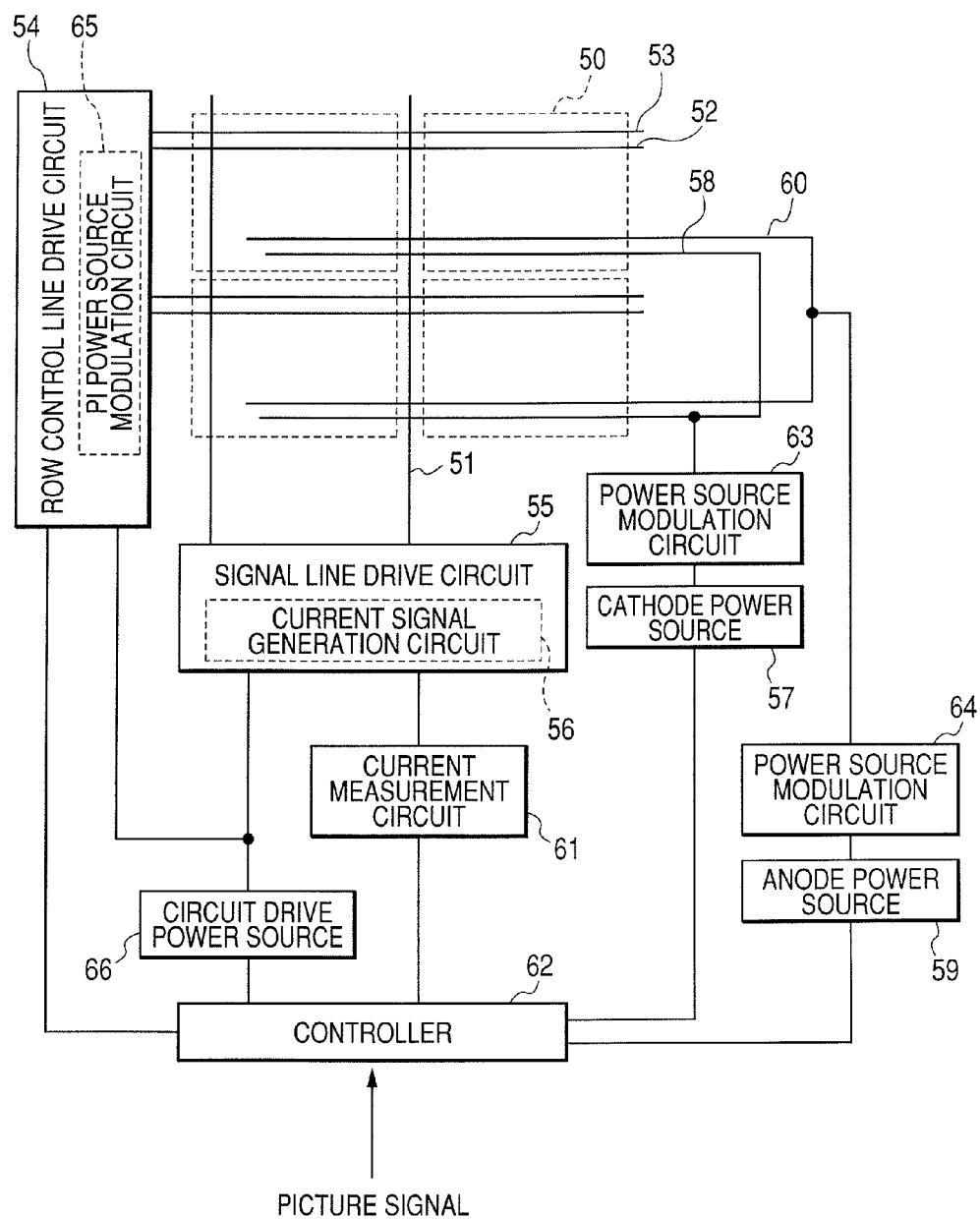
FIG. 14 is a block diagram illustrating a configuration of an organic EL display apparatus according to Embodiment 6 of the present invention.
Figure 15:
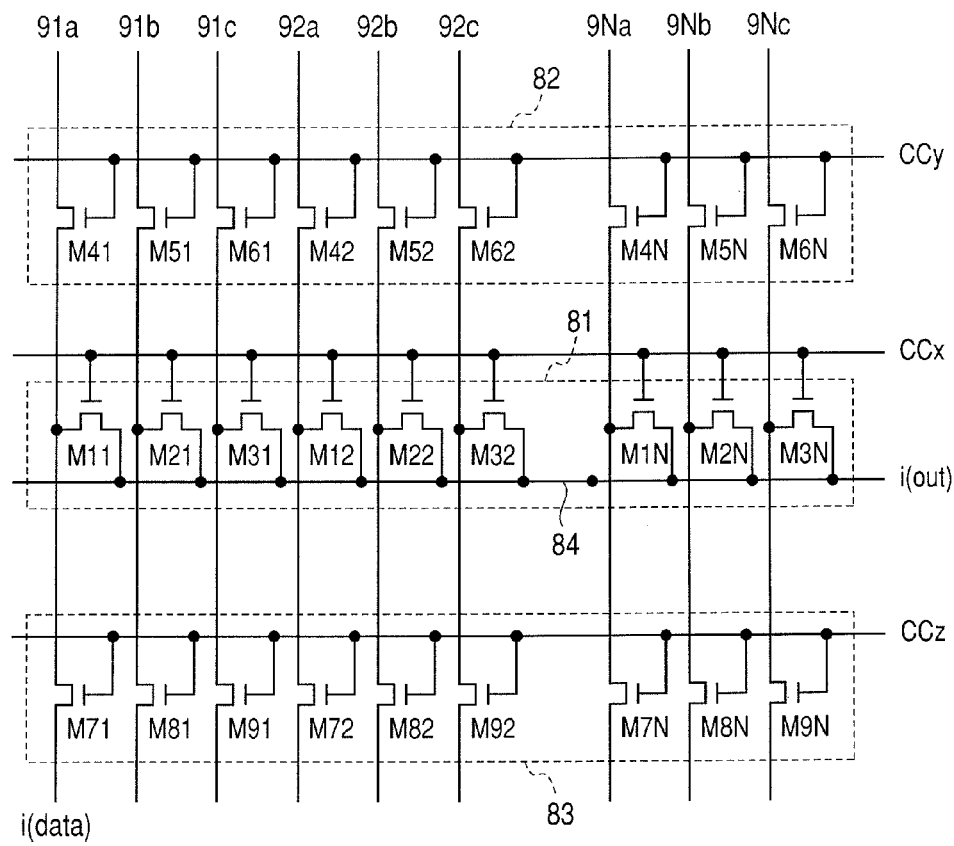
FIG. 15 is a diagram illustrating a circuit configuration of an output portion of a signal line drive circuit illustrated in FIG. 14.

FIG. 14 is a block diagram showing a configuration of the organic EL display apparatus according to this embodiment, and FIG. 15 is a circuit diagram showing a configuration in a signal line drive circuit thereof.

In FIG. 14, the same organic EL display apparatus of a current setting system as that of Embodiment 5 is applied. In the organic EL display apparatus illustrated in FIG. 14, in a pixel matrix array region, a plurality of pixels 50 is arranged in a matrix array. The pixels 50 have the circuit illustrated in FIG. 11, and are operated in the same way as in Embodiment 5 in accordance with the timing chart illustrated in FIG. 12.

Each of the plurality of pixels 50 is connected to a row control line drive circuit (row control circuit) 54 via row control lines 52 and 53 for two row control signals P1 and P2, respectively, and connected to a signal line drive circuit 55 via a signal line 51. In the row control line drive circuit 54, a P1 power source modulation circuit 65 for modulating an output voltage of the row control signal P1 is provided. Further, each of the plurality of pixels 50 is connected to a cathode power source 57 via a cathode line 58, and connected to an anode power source 59 via an anode line 60. A power source modulation circuit 63 for modulating a cathode voltage Vc is provided between the cathode line 58 and the cathode power source 57. Further, a power source modulation circuit 64 for modulating an anode voltage Va is provided between the anode line 60 and the anode power source 59.

The row control line drive circuit 54, the signal line drive circuit 55, the cathode power source 57, and the anode power source 59 are connected to the controller 62, whereby each operation is controlled. A circuit driving power source 66 is connected to the row control line drive circuit 54 and the signal line drive circuit 55. A current measurement circuit 61 is interposed between the signal line drive circuit 55 and the controller 62. In the signal line drive circuit 55, a current signal generation circuit 56 is formed, and has a function (voltage current conversion circuit) for converting a picture signal sent from the controller 62 into a current.

FIG. 15 illustrates a circuit configuration of an output portion in the signal line drive circuit 55.

In FIG. 15, a current signal output line 84 is a line to which an output of the current signal generation circuit 56 is connected in common, and a switching portion 81 controls the connection between the output of the current signal generation circuit 56 and the current signal output line 84. Disconnecting portions 82 and 83 serve as switching portions for controlling the connection between the current signal generation circuit 56 and a pixel 50 side. 91a to 9Nc denote signal lines. M11 to M3N, M41 to M6N, and M71 to M9N denote transistors (field-effect transistors). i(out) denotes a total current of the current signal output line 84. CCx, CCy, and CCz denote total current detection control signals. The current signal output line 84 is grounded via the current measurement circuit 61 illustrated in FIG. 14. The current measurement circuit 61 measures a current i(out) flowing from the current signal output line 84 to the ground.

The switching portion 81 connects the respective signal lines 91a to 9Nc to the current signal output line 84, and includes transistor groups M11 to M1N being switches capable of opening/closing. The disconnecting portion 82 includes disconnection transistor groups M41 to M6N being switches capable of opening/closing, connected to the respective signal lines 91a to 9Nc between the switching portion 81 and the pixel circuit 50. Further, the disconnecting portion 83 includes disconnection transistor groups M71 to M9N being switches capable of opening/closing, connected to the respective signal lines between the switching portion 81 and the signal line drive circuit 55.

The signal lines 91a to 9Nc connecting the signal line drive circuit 55 to the pixel circuit 50 in the corresponding column are connected to source electrodes of M11 to M6N of the switching portion 81 via the M41 to M6N of the disconnecting portions 82. Drain electrodes of the M11 to M3N of the switching portions 81 are all connected to the current signal output line 84 in common. The total current i(out) is output from the current signal output line 84.

On the other hand, drain electrodes of the M41 to M6N of the disconnecting portion 82 are connected to the signal lines 91a to 9Nc of the corresponding column, respectively. Gate electrodes of the M11 to M3N of the switching portion 81 are all connected in common, and receive a total current detection control signal CCx from the controller 62. Gate electrodes of the M41 to M6N of the disconnecting portion 82 and gate electrodes of the M71 to M9N of the disconnecting portion 83 are all connected in common, and receive total current detection control signals CCy and CCz from the controller 62. All the transistors are operated with a switch, and which of the p-type and n-type is used and configuration thereof are not limited as long as the transistors are controlled appropriately.

As a substrate constituting a display panel, a glass substrate can be used desirably. On a glass substrate, TFTs using amorphous silicon or polysilicon are formed, and the signal line drive circuit 55 and the row control drive circuit 54 are constituted. However, due to the characteristics, the TFTs have a larger variation among devices compared with CMOS transistors, and a current output of the current signal generation circuit 56 is also different from adjacent signal lines, with the result that non-uniform luminance occurs on the display panel. This embodiment has a function of measuring the output of the current signal generation circuit 56 by the current measurement circuit 61 so as to correct the output variation, thereby being capable of reducing non-uniform luminance.

Figure 16:
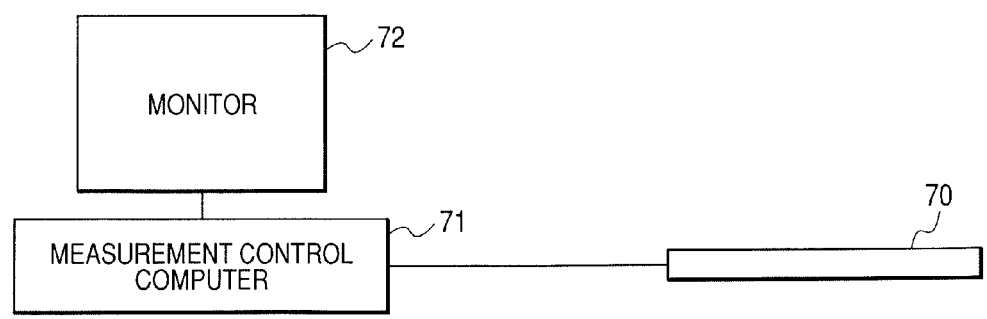
FIG. 16 is a schematic diagram of an inspection apparatus used in a method of producing an organic EL display apparatus according to Embodiment 6.
Figure 17:
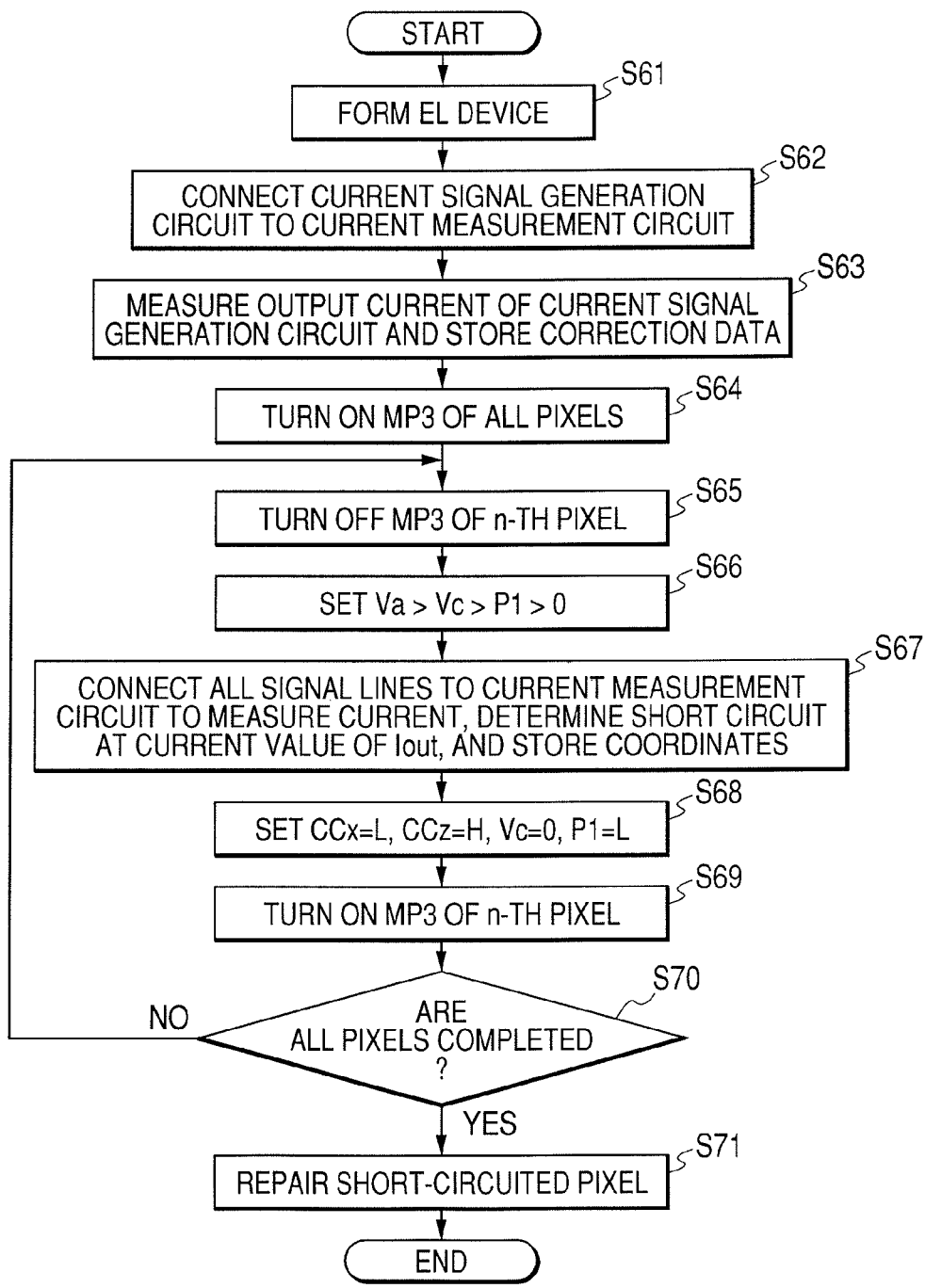
FIG. 17 is a flowchart schematically illustrating the method of producing an organic EL display apparatus according to Embodiment 6.

Next, referring to FIGS. 16 and 18, a method of producing an organic EL display apparatus of this embodiment will be described. FIG. 16 is a schematic diagram of the inspection apparatus serving as a repair apparatus used in the defective pixel detection step and the repair step in the production method. FIG. 17 is a flowchart schematically illustrating a production method using the inspection apparatus, and FIG. 18 is a timing chart illustrating the production method.

First, in the same EL device formation step as that described above, an organic EL device is formed (Step S61). After that, the process proceeds to the defective pixel detection step and the repair step using the inspection apparatus illustrated in FIG. 16. At this time, first, the organic EL display apparatus 70 is connected to the measurement control computer 71 as illustrated in FIG. 16. A monitor 72 is connected to the measurement control computer 71.

Figure 18:
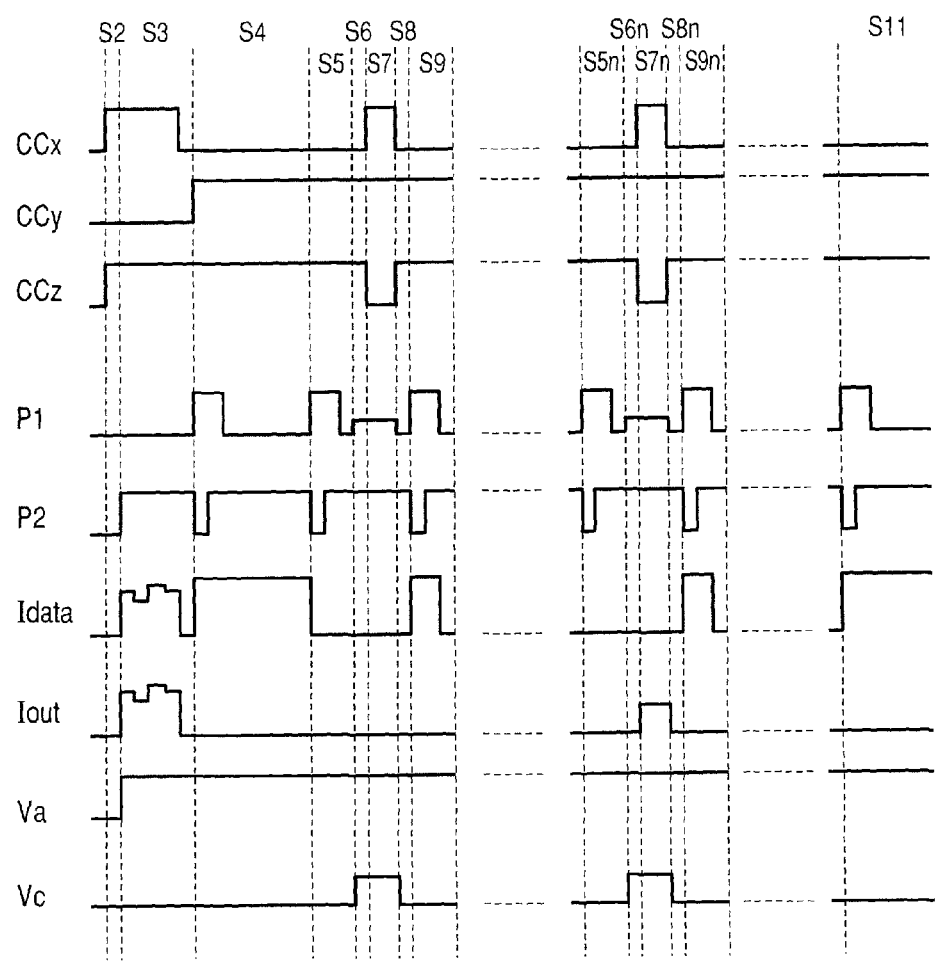
FIG. 18 is a timing chart illustrating a current detection method used in the method of producing an organic EL display apparatus according to Embodiment 6.

Next, during a period S2 of FIG. 18, a control signal is sent from the measurement control computer 71 to the signal line drive circuit 55 via the controller 62, whereby CCx, CCy, and CCz are set at an H level, an L level, and an H level, respectively. Then, the current signal generation circuit 56 in the signal line drive circuit 55 and the signal lines 91a to 9Nc are disconnected by the disconnecting portion 82, and all the outputs of the current signal generation circuit 56 are connected to the current measurement circuit 61 (Step S62).

After that, during a period S3, a control signal is sent from the controller 62 to the signal line drive circuit 55 so that a piece of current signal Idata is output. Then, an output current of the current signal generation circuit 56 in the signal line drive circuit 55 flows to the current measurement circuit 61, whereby a current value Iout can be measured by the current measurement circuit 61. Such an operation is performed successively to measure the amounts of all the currents of the current signal generation circuit 56, and the measurement results are stored as correction data (Step S63). After that, in a case where a picture signal is sent to the signal line drive circuit 55, the signal is corrected based on the stored correction data, whereby the occurrence of display unevenness is suppressed.

Next, during a period S4, the measurement control computer 71 sends a picture signal that lights all the pixels to the controller 62, and turns on the MP3 of all the pixels 50 (Step S64). After that, the output of the current signal generation circuit 56 is turned off. At this time, the P1 is at an L level and the P2 is at an H level, so the MP1 is turned off. As a result, a current does not flow to the organic EL device, and the organic EL device does not emit light.

Next, during a period S5, the current signal Idata is set to be 0, and current programming is performed with respect to an n-th pixel, whereby the MP3 is turned off (Step S65).

Next, during a period S6, the measurement control computer 71 sends a control signal to the P1 power source modulation circuit 65 and the power source modulation circuit 63 via the controller 62. Thus, the P1 power source modulation circuit 65 and the power source modulation circuit 63 modulate the potential of the row control signal P1 in a row belonging to the n-th pixel and the cathode potential Vc to set Va>Vc>P1>0 (Step S66).

During a period S7, the measurement control computer 71 sends a control signal to the signal line drive circuit 55 via the controller 62 to set CCx and CCz at an H level and an L level, respectively, whereby all the signal lines 91a to 9Nc are connected to the current measurement circuit 61 (Step S67). Herein, the potential of the signal lines is 0 V since the signal lines are grounded via the current measurement circuit 61. Further, the gate potential of the MN1 becomes P1. Accordingly, the MN1 becomes an ON state. In a case where the organic EL device is not short-circuited at the n-th pixel, the potential of the node N1 becomes 0 V via the MN1. Then, the gate potential of the MP1 becomes P1 and the potential of the node N1 becomes 0 V, so the MP1 is turned off. In this case, even when the anode potential Va of the organic EL device becomes 0 V due to the leakage between the source and the drain of the MP1, the cathode potential Vc satisfies the condition Vc>0, so a current does not flow to the organic EL device, and a current is not detected in the current measurement circuit 61.

In contrast, in a case where the organic EL device is short-circuited at the n-th pixel, the anode potential Va becomes Vc through the short-circuited portion of the organic EL device as in a period S-n after the same periods S5a to S6n as the periods S5 to S6. Accordingly, the source and drain potentials of the MP1 become higher than the gate potential of the MP1. Thus, the MP1 is turned on. A current flows to the signal lines from the cathode power source 57 via the organic EL device, MP1, and MN1. Therefore, a current Iout is detected in the current measurement circuit 61 via the switching portion 81 in the signal line drive circuit 55. Herein, regarding the pixels other than the n-th pixel, the MP3 is in an ON state, so the potential of the node N1 becomes Va through the MP3. Further, the potential of the node N1 becomes higher than the gate potential P1 of the MN1 (Va>P1). Thus, the MN1 is turned off. Accordingly, a current does not flow from the pixels other than the n-th pixel to the current measurement circuit 61, and a short-circuit of the organic EL device at the n-th pixel can be inspected with good precision.

Next, during a period S8, the measurement control computer 71 sends a control signal to the signal line drive circuit 55 via the controller 62, thereby setting CCx, CCz, Vc, and P1 to be at an L level, an H level, 0 V, and an L level, respectively (Step S68). Then, during a period S9, current programming is performed so that the MP3 of the n-th pixel is turned on, and then, the inspection of the n-th pixel is completed (Step S69). This operation also applies to periods S8n to S9n.

The above-mentioned operation is repeated successively over all the pixels 50, whereby the organic EL devices over the entire display region surface can be inspected for a defect (Step S70).

Then, during a period S11, the measurement control computer 71 creates an image pattern that sets a normal pixel to a non-lighting state and a defective pixel to a lighting state from the obtained positional data of the defective pixel, and sends a picture signal corresponding to the image pattern to the controller 62. Then, in the organic display apparatus 70, a current flows only to the defective pixel in which a short-circuit has been detected, and this state is maintained, whereby only the defective pixel can be repaired (Step S71).

Thus, also by the method of producing an organic EL display apparatus as in this embodiment, the same effect as that of Embodiment 1 can be obtained.

In order to obtain the above-mentioned effect, as the configuration of the organic EL display apparatus, it is necessary that the power source modulation circuits 63 and 64 for modulating an anode voltage or a cathode voltage are provided as illustrated in FIG. 14. Further, in order to detect a short-circuited pixel, the row control line drive circuit 54 is provided with the P1 power source modulation circuit 65, whereby the row control signal P1 is modulated. Further, the cathode electrode is generally formed over the entire display region as a common electrode, and generally applied with 0V. Further, as a potential of the row control line drive circuit 54 and the circuit driving power source 66 of the signal line drive circuit 56, 0 V is input from the controller 62. In order to modulate the cathode voltage Vc, it is necessary that the drive circuit power source 66 and the cathode power source 57 are connected independently as illustrated in FIG. 14.

Further, even when a shift register is provided in the signal line drive circuit 56, and a circuit for connecting the current measurement circuit 61 to the signal lines one at a time is provided, a short-circuited pixel can be detected, and the same effect as that described above is obtained.

Further, in Embodiments 1 to 6, the TFTs using amorphous silicon or polysilicon are formed as transistor devices on a glass substrate constituting a display panel are described as an example. However, the present invention is not limited thereto. For example, even when an inorganic semiconductor or an organic semiconductor other than silicon is used, the same effect is obtained.

Example

Hereinafter, an example of the present invention will be described. This example corresponds to Embodiment 1 described above.

First, in this example, an active matrix substrate with 960 pixels in a horizontal direction and 240 pixels in a vertical direction (total number of pixels: 230400), a pixel size of 51 μm×153 μm, and a diagonal size of 2.4 inches was formed. After that, as an anode electrode, Al and IZO were stacked in this order at a thickness of 100 nm and 20 nm, respectively, by sputtering, followed by photoetching, whereby an anode electrode was formed at a position corresponding to each pixel.

Next, aNPD with hole transportability was formed into a film at a film formation rate of 0.2 to 0.3 nm/sec. by resistance heating vapor deposition, and a hole transporting layer with a thickness of 35 nm was formed. The hole transporting layer, a light emitting layer, and an electron injecting layer were deposited from the vapor in a predetermined portion by using the same vapor deposition mask.

Then, Alq3 that was an alkylate complex was formed into a film with a thickness of 15 nm on the hole transporting layer by resistance heating vapor deposition under the same film formation condition as that of the hole transporting layer, whereby a light emitting layer was formed.

Then, Alq3 and cesium carbonate ($Cs_3CO_3$) were formed into a film on the light emitting layer by resistance heating codeposition by adjusting the respective vapor deposition rates so that Alq3 and cesium carbonate ($Cs_3CO_3$) were mixed at a ratio of 9:1, whereby an electron injecting layer with a thickness of 35 nm was formed. Specifically, materials set in the respective vapor deposition boats were evaporated by a resistance heating system, and an organic layer was formed at a vapor deposition rate of 5 Å/sec.

Next, on the electron injecting layer, a cathode electrode was formed by mask film formation by DC magnetron sputtering using an Ag target so that the thickness was 10 nm. Although Ag is adopted as a cathode, the thickness thereof is very small, so Ag functions as a semi-transparent film, and light with higher color purity can be taken out when light emitted by EL light-emission is multi-reflected between the anode and the cathode.

As described above, the anode electrode, an insulating layer, the hole transporting layer, the light emitting layer, the electron injecting layer, and the cathode electrode were provided on the substrate, whereby an organic light emitting layer was formed.

Next, a moisture absorbing film of strontium oxide was formed on an inner side of cover glass, and the periphery of the cover glass was coated with a UV-curable sealant. The resultant cover glass was bonded to the organic EL device substrate, and irradiated with UV for 6 minutes, whereby the cover glass and the organic EL device substrate were sealed by adhesion.

When the organic EL display apparatus thus produced was lit, 4111 non-lighting pixels were detected. When a current of 140 nA was caused to flow to each non-lighting pixel thus detected for about 96 hours, the number of the non-lighting pixels was reduced to 77.

Further, the same effect was observed even in a panel sealed with a protective film. As the protective film, a silicon nitride film with a thickness of 3 μm stacked on a substrate using a chemical vapor deposition (CVD) apparatus was used.

Although an attempt was made so as to repair the organic EL display apparatus sealed with the protective film with a laser, the protective film was broken by the irradiation of a laser, and water entered a device and the degradation in the device was observed Thus, it is very difficult to repair the organic EL display apparatus sealed with the silicon nitride film by the irradiation of a laser. However, according to this example, it was confirmed that the repair can be performed without damaging the silicon nitride film.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-142738, filed May 23, 2006, which is hereby incorporated by reference herein in its entirety.

What is claimed is:

1. A method of producing an organic electroluminescence display apparatus comprising a plurality of organic electroluminescence light emitting devices, comprising the steps of:
   (1) forming the plurality of organic electroluminescence light emitting devices and a drive circuit for driving each of the organic electroluminescence light emitting devices on a substrate;
   (2) measuring one of a light emission amount when a current is supplied from the drive circuit and a current amount when a voltage of a polarity opposite to a polarity of a voltage applied during light emission is applied to the organic electroluminescence light emitting device, with respect to each of the plurality of organic electroluminescence light emitting devices,
   (3) specifying a defective organic electroluminescence light emitting device in which one of the light emission amount and the current amount is not usual; and
   (4) repairing the defective organic electroluminescence light emitting device by supplying a current to the defective organic electroluminescence light emitting device from the drive circuit.

2. The method according to claim 1, wherein the step of specifying the defective organic electroluminescence light emitting device comprises detecting a position of an organic electroluminescence light emitting device in which a light emission amount is smaller than a predetermined light emission amount among the plurality of organic electroluminescence light emitting elements by an optical unit, when a current is supplied to all the plurality of organic electroluminescence light emitting elements from the drive circuit.

3. The method according to claim 1, wherein the step of specifying the defective organic electroluminescence light emitting device in which the current amount is unusual comprises detecting an organic electroluminescence light emitting device in which the current amount is larger than a predetermined current amount.

4. The method according to claim 1, wherein the step of repairing the defective organic electroluminescence light emitting device comprises repeating measurement of a current amount obtained when the voltage of a polarity opposite to the polarity of voltage of light emission is applied and supply of a current for repair from the drive circuit, with respect to the defective organic electroluminescence light emitting device, by increasing the current for repair gradually.

5. The method according to claim 1, wherein the step of repairing the defective organic electroluminescence light emitting device comprises applying a predetermined voltage to all the defective organic electroluminescence light emitting devices for a predetermined period of time.

6. The method according to claim 1, further comprising aging after the steps (1) to (3).

7. The method according to claim 1, wherein:
   the organic electroluminescence display apparatus comprises a plurality of signal lines, a plurality of scanning lines, a plurality of voltage supply lines, and a common electrode on the substrate,
   the organic electroluminescence light emitting device has one electrode connected to the common electrode; and
   the drive circuit comprises:
      a switching transistor whose source is connected to one of the plurality of signal lines and whose gate is connected to one of the plurality of scanning lines;
      an operation transistor whose gate is connected to a drain of the switching transistor, whose source is connected to the voltage supply line, and whose drain is connected to the other electrode of the organic electroluminescence light emitting device; and
      a holding capacitor provided between the gate and the source of the operation transistor, for holding a potential between the gate and the source of the operation transistor.

8. The method according to claim 7, wherein:
   the step of specifying the organic electroluminescence light emitting device in which the current amount is unusual comprises steps of:
      turning off the operation transistors of all the drive circuits; and
      turning on the operation transistors successively, changing a potential of the common electrode from a potential applied to the common electrode during light emission to a potential of the voltage supply line to apply a voltage to the organic electroluminescence light emitting device of an opposite polarity to the voltage applied to the organic electroluminescence light emitting device during light emission, measuring a current through the organic electroluminescence light emitting device in a direction opposite to a direction of the current flowing through the organic electroluminescence light emitting device during light emission, and determining by the measured current whether the rectification characteristics of the organic electroluminescence light emitting device is unusual.

9. An organic electroluminescence display apparatus including a plurality of electroluminescence light emitting devices, comprising:
   a plurality of organic electroluminescence light emitting devices formed on a substrate;
   a drive circuit for driving each of the organic electroluminescence light emitting devices;
   a unit for applying a voltage of a polarity opposite to a polarity obtained during light emission, to each of the plurality of organic electroluminescence light emitting devices;
   a unit for measuring an amount of a current flowing to the organic electroluminescence light emitting device applied with the voltage of the opposite polarity;

a unit for determining the defective organic electroluminescence light emitting device from the measured current amount; and a unit for repairing the defective organic electroluminescence light emitting device by supplying a current from the drive circuit to the defective organic electroluminescence light emitting device.

10. The organic electroluminescence display apparatus according to claim 9 further comprising:

a plurality of signal lines;

a plurality of scanning lines;

a plurality of voltage supply lines; and a common electrode on the substrate, wherein the drive circuit comprises:

a switching transistor whose source is connected to one of the plurality of signal lines and whose gate is connected to one of the plurality of scanning lines;

an operation transistor whose gate is connected to a drain of the switching transistor, whose source is connected to the voltage supply line, and whose drain is connected to the other electrode of the organic electroluminescence light emitting device; and a holding capacitor provided between the gate and the source of the operation transistor, for holding a voltage between the gate and the source of the operation transistor.

11. The organic electroluminescence display apparatus according to claim 10, wherein the unit for applying a voltage of a polarity opposite to a polarity obtained during light emission comprises a circuit for changing a potential of the common electrode from a potential obtained during light emission to a potential of the voltage supply line in a state where a voltage for turning on the operation transistor with respect to one of the plurality of organic electroluminescence light emitting devices is held in the holding capacitor, and a voltage for turning off the operation transistor with respect to another organic electroluminescence light emitting device is held in the holding capacitor.

12. The organic electroluminescence display apparatus according to claim 9, the unit for measuring an amount of a current comprises:

a current measurement circuit provided outside the substrate; and a switch for connecting the signal lines to the current measurement circuit.

* * * * *